United States Patent
Liao et al.

(10) Patent No.: US 11,652,148 B2
(45) Date of Patent: May 16, 2023

(54) METHOD OF SELECTIVE FILM DEPOSITION AND SEMICONDUCTOR FEATURE MADE BY THE METHOD

(71) Applicant: TAIWAN SEMICONDUCTOR MANUFACTURING COMPANY, LTD., Hsinchu (TW)

(72) Inventors: Song-Fu Liao, Hsinchu (TW); Hai-Ching Chen, Hsinchu (TW); Chung-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/471,736

(22) Filed: Sep. 10, 2021

(65) Prior Publication Data
US 2022/0367648 A1     Nov. 17, 2022

Related U.S. Application Data

(60) Provisional application No. 63/188,137, filed on May 13, 2021.

(51) Int. Cl.
*H01L 21/28* (2006.01)
*H01L 29/66* (2006.01)
(Continued)

(52) U.S. Cl.
CPC .. *H01L 29/40111* (2019.08); *H01L 27/11597* (2013.01); *H01L 29/66969* (2013.01); *H01L 21/02642* (2013.01); *H01L 21/443* (2013.01); *H01L 21/47573* (2013.01); *H01L 29/7869* (2013.01)

(58) Field of Classification Search
None
See application file for complete search history.

(56) References Cited

U.S. PATENT DOCUMENTS 9,076,722 B2 * 7/2015 Sakuma .............. H01L 45/1253
9,698,155 B2 * 7/2017 Shim ................. H01L 27/11556
(Continued)

*Primary Examiner* — Vincent Wall
(74) *Attorney, Agent, or Firm* — Birch, Stewart, Kolasch & Birch, LLP

(57) ABSTRACT

A method for manufacturing a semiconductor feature includes: alternatingly forming first and second dielectric layers on a semiconductor substrate along a vertical direction; forming multiple spaced-apart trenches penetrating the first and second dielectric layers; forming multiple support segments filling the trenches; removing the second dielectric layers to form multiple spaces; forming multiple conductive layers filling the spaces; removing the support segments to expose the conductive layers and the first dielectric layers; selectively forming a blocking layer covering the first dielectric layers outside of the conductive layers; forming multiple selectively-deposited sub-layers on the exposed conductive layers outside of the blocking layer and each connected to one of the conductive layers; forming multiple channel sub-layers on the selectively-deposited sub-layers outside of the blocking layer; removing the blocking layer; forming multiple isolation sub-layers filling the trenches; and forming multiple source/drain segments each connected to corresponding ones of the channel sub-layers.

20 Claims, 17 Drawing Sheets

(51) Int. Cl.
  *H01L 27/11597* (2017.01)
  *H01L 29/786* (2006.01)
  *H01L 21/443* (2006.01)
  *H01L 21/02* (2006.01)
  *H01L 21/4757* (2006.01)

(56) References Cited

U.S. PATENT DOCUMENTS

| | | | | |
|---|---|---|---|---|
| 10,121,965 | B1* | 11/2018 | Uno | G11C 11/5685 |
| 10,381,559 | B1* | 8/2019 | Zhou | H01L 27/24 |
| 10,490,571 | B2* | 11/2019 | Yoo | H01L 27/11514 |
| 10,833,101 | B2* | 11/2020 | Shimomura | G11C 11/5621 |
| 11,158,651 | B2* | 10/2021 | Lee | H01L 27/11582 |
| 11,335,685 | B2* | 5/2022 | Son | H01L 27/10885 |
| 2009/0121271 | A1* | 5/2009 | Son | H01L 21/8221 257/315 |
| 2010/0133606 | A1* | 6/2010 | Jang | H01L 27/11556 257/329 |
| 2010/0207184 | A1* | 8/2010 | Kim | H01L 27/11578 257/314 |
| 2010/0226195 | A1* | 9/2010 | Lue | H01L 29/792 257/E21.602 |
| 2011/0266604 | A1* | 11/2011 | Kim | H01L 27/11575 257/314 |
| 2012/0001249 | A1* | 1/2012 | Alsmeier | H01L 29/4234 438/266 |
| 2012/0007167 | A1* | 1/2012 | Hung | H01L 21/768 257/E21.645 |
| 2012/0052674 | A1* | 3/2012 | Lee | H01L 27/11582 257/E21.645 |
| 2014/0273372 | A1* | 9/2014 | Sakuma | H01L 29/40117 438/268 |
| 2015/0140753 | A1* | 5/2015 | Simsek-Ege | H01L 27/11524 438/268 |
| 2016/0225866 | A1* | 8/2016 | Peri | H01L 27/11575 |
| 2018/0130823 | A1* | 5/2018 | Kim | H01L 29/6684 |
| 2019/0148406 | A1* | 5/2019 | Liu | H01L 29/6684 257/295 |
| 2020/0035696 | A1* | 1/2020 | Zhu | H01L 27/11556 |
| 2020/0119030 | A1* | 4/2020 | Dasgupta | H01L 27/11556 |
| 2020/0212068 | A1* | 7/2020 | Lee | H01L 29/42372 |
| 2020/0321444 | A1* | 10/2020 | Lien | H01L 29/4234 |
| 2020/0402984 | A1* | 12/2020 | Reznicek | H01L 29/66545 |
| 2021/0036020 | A1* | 2/2021 | Park | H01L 28/40 |
| 2021/0050372 | A1* | 2/2021 | Sharangpani | H01L 27/11597 |
| 2021/0210497 | A1* | 7/2021 | Yang | H01L 27/249 |
| 2021/0217775 | A1* | 7/2021 | Zhang | H01L 27/11587 |
| 2021/0375927 | A1* | 12/2021 | Chia | H01L 27/1159 |
| 2021/0398989 | A1* | 12/2021 | Lin | H01L 27/11578 |
| 2021/0408022 | A1* | 12/2021 | Young | H01L 27/0924 |
| 2022/0013532 | A1* | 1/2022 | Young | H01L 29/0669 |
| 2022/0028893 | A1* | 1/2022 | Lin | G11C 7/18 |
| 2022/0037253 | A1* | 2/2022 | Yang | H01L 27/11578 |
| 2022/0123003 | A1* | 4/2022 | Young | G11C 7/18 |
| 2022/0130856 | A1* | 4/2022 | Kim | H01L 27/11578 |
| 2022/0140104 | A1* | 5/2022 | Heo | H01L 29/517 257/295 |
| 2022/0285394 | A1* | 9/2022 | Ling | H01L 27/11597 |
| 2022/0367648 | A1* | 11/2022 | Liao | H01L 29/66969 |
| 2022/0384459 | A1* | 12/2022 | Lu | H01L 27/11597 |
| 2022/0384470 | A1* | 12/2022 | Jiang | H01L 27/11587 |

* cited by examiner

METHOD OF SELECTIVE FILM DEPOSITION AND SEMICONDUCTOR FEATURE MADE BY THE METHOD

REFERENCE TO RELATED APPLICATION

This application claims priority of U.S. Provisional Application No. 63/188,137 filed on May 13, 2021, the contents of which is incorporated herein by reference in its entirety.

BACKGROUND

In the field of semiconductor manufacturing, it is often needed to form thin films with precisely defined dimensions in certain areas. This is especially challenging with the continuous shrinking of critical dimensions of semiconductor devices. In addition, it is also challenging to form thin films with particular shapes on a three-dimensional (3D) structure, especially in a narrow trench.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
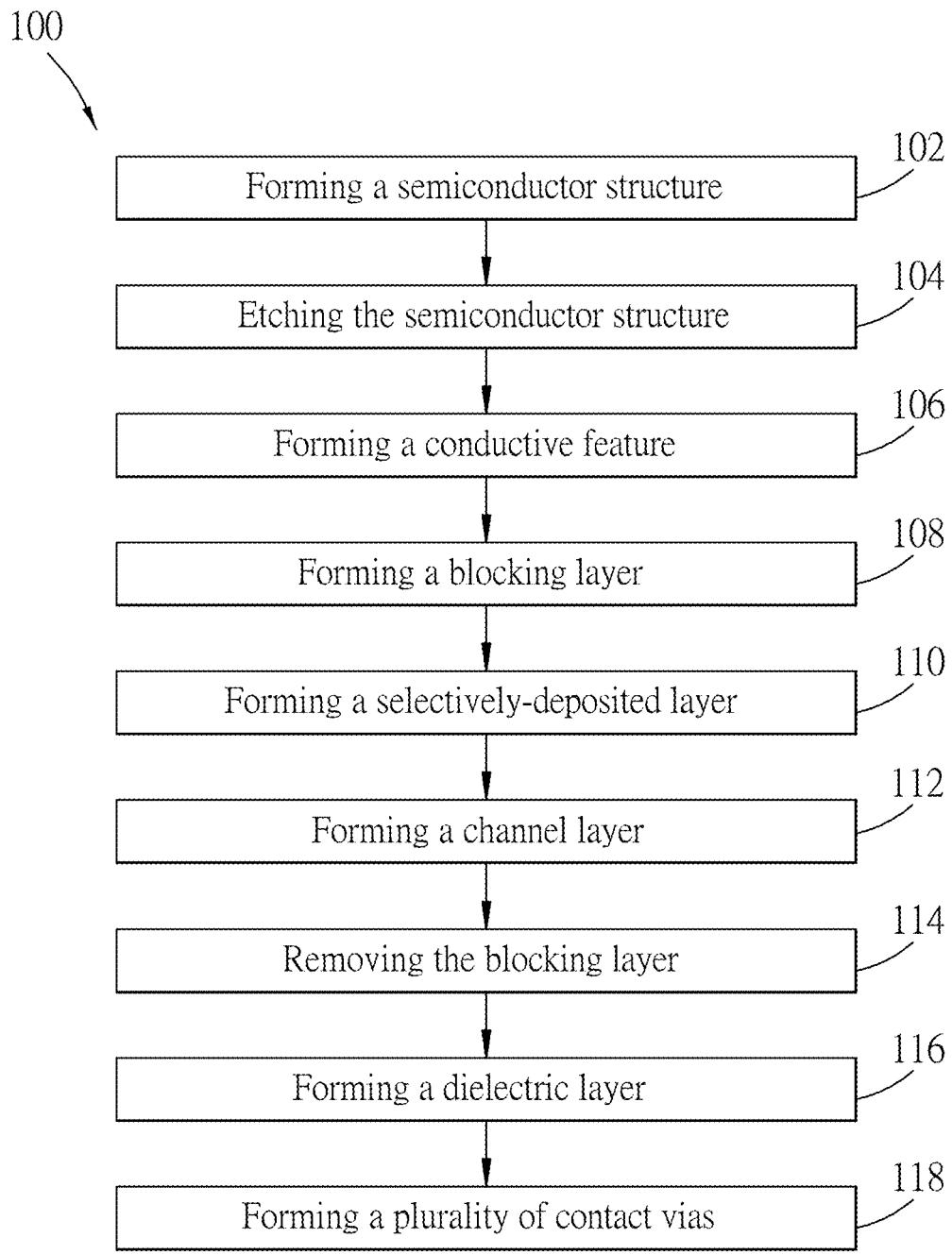
FIG. 1 is a flow diagram of a method for manufacturing a semiconductor feature in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor feature 300 (see FIG. 8) in accordance with some embodiments. FIGS. 2 to 8 are schematic views showing intermediate stages of the method 100 as depicted in FIG. 1. Additional steps which are not limited to those described in the method 100, can be provided before, after or during manufacturing of the semiconductor feature 300, and some of the steps described herein may be replaced by other steps or be eliminated. Similarly, additional features may be present in the semiconductor feature 300, and/or features present may be replaced or eliminated in additional embodiments.

Referring to FIG. 1, the method 100 begins at block 102, where a semiconductor structure is formed. Referring to the example illustrated in FIG. 2, the semiconductor structure 200 may include a semiconductor substrate 201 made of an elemental semiconductor, a compound semiconductor, other suitable materials, or any combination thereof. The elemental semiconductor may contain a single species of atoms, such as Si, Ge or other suitable materials, e.g., other elements from group 14 of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or the like. In some embodiments, the composition of the compound semiconductor including the aforesaid elements may change from one ratio at one location to another ratio at another location (i.e., the compound semiconductor may have a gradient composition). In some embodiments, the semiconductor substrate 201 may be a semiconductor-on-insulator (501) substrate, such as silicon germanium-on-insulator (SGOI) substrate, or suitable types of substrates. In some embodiments, the semiconductor substrate 201 may include a non-semiconductor material, such as glass, quartz (e.g., fused quartz), calcium fluoride ($CaF_2$), other suitable materials, or any combination thereof. In some embodiments, the semiconductor structure 200 may further include a base layer 202 (e.g., a dielectric-containing feature) that is disposed on the semiconductor substrate 201 and that may be made of a dielectric material, such as silicon oxide ($SiO_x$), metal oxide, other suitable materials, or any combination thereof. In some embodiments, metal oxide may include $Al_2O_3$, FeO, $TiO_2$, $HfO_2$, $ZrO_2$, HfZrO, InSnO (i.e., indium tin oxide, ITO), ZnO, InGaZnO (i.e., indium gallium zinc oxide, IGZO), PtO, other suitable materials, or any combination thereof. In some embodiments, the base layer 202 may contain hydroxyl groups at its surface.

Figure 2:
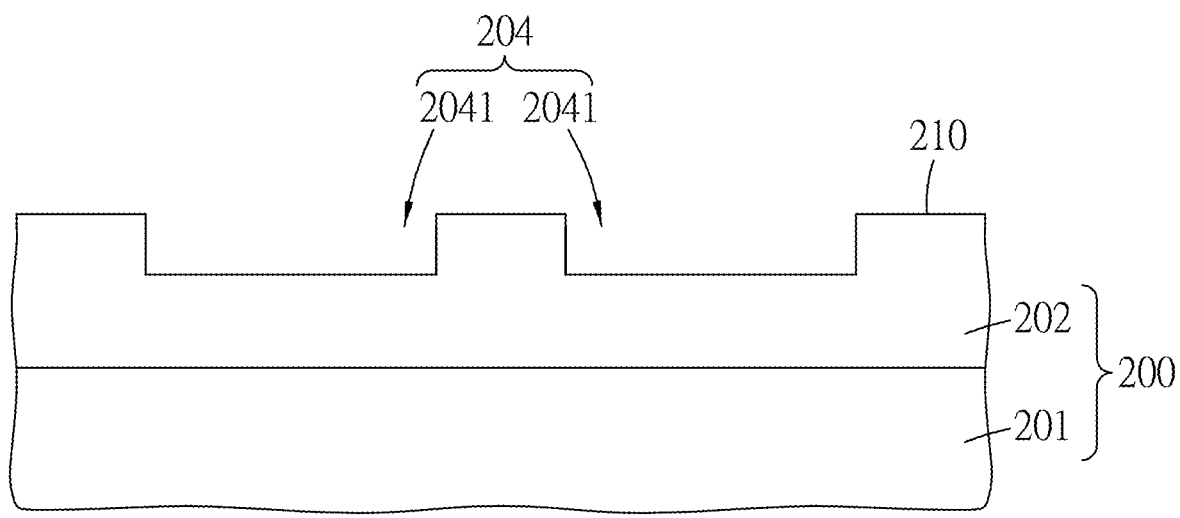
FIGS. 2 to 8 illustrate intermediate stages of the method as depicted in FIG. 1.

Referring to FIG. 1, the method 100 then proceeds to block 104, where the semiconductor structure is etched. Referring to FIG. 2, in some embodiments, the base layer 202 of the semiconductor structure 200 is etched to form a groove structure 204 which includes at least one groove 2041. There are two grooves 2041 schematically shown in FIG. 2, but the number of the groove(s) 2041 may be changed according to practical requirements. In some embodiments, the grooves 2041 may be formed by plasma dry etching, wet chemical etching, other suitable techniques, or any combination thereof. The dimensions, including width and/or depth of each of the grooves 2041 may be adjusted according to practical requirements.

Figure 3:
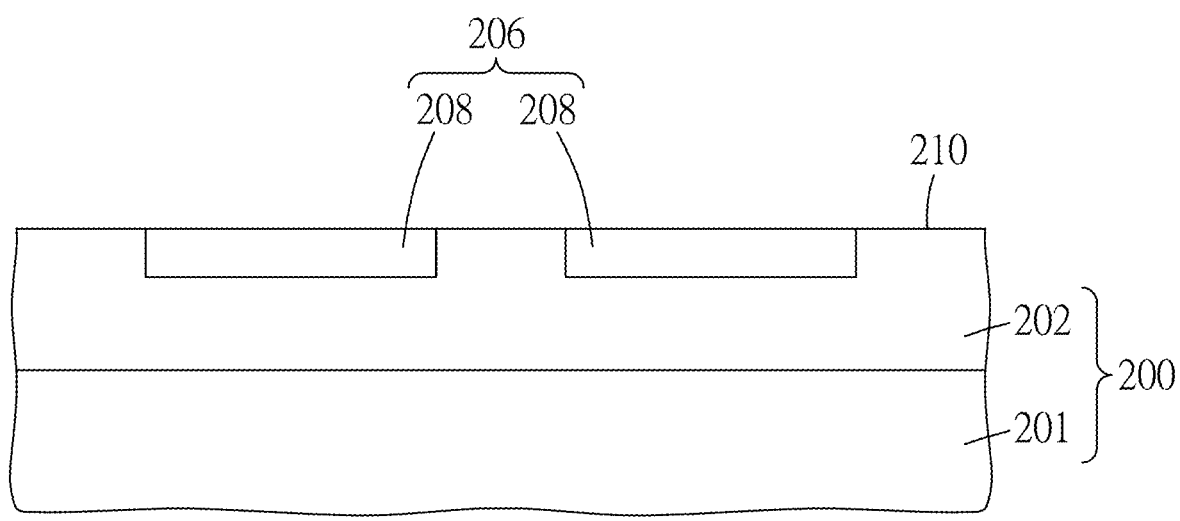

Referring to FIG. 1, the method 100 then proceeds to block 106, where a conductive feature is formed. In some embodiments, as shown in FIG. 3, the conductive feature 206 (e.g., a metal-containing feature) includes a plurality of conductive structures 208 that are respectively filled in the grooves 2041 (see FIG. 2). Referring further to FIG. 2, in some embodiments, the conductive feature 206 may be formed by depositing a conductive material on a top surface 210 of the base layer 202 of the semiconductor structure 200, and then filling the grooves 2041 by physical vapor deposition (PVD), chemical vapor deposition (CVD), atomic layer deposition (ALD), plating, other suitable techniques, or any combination thereof. Then, the conductive material remaining above the top surface 210 of the base layer 202 of the semiconductor structure 200 is removed by chemical mechanical planarization (CMP), dry etching, other suitable techniques, or any combination thereof, thereby obtaining the conductive feature 206 filled in the grooves 2041 of the groove structure 204 (see FIG. 2). In some embodiments, during the removal step, a top portion of the base layer 202 may be slightly removed. In some embodiments, the conductive material for making the conductive feature 206 may be metal (e.g., Cu, W, Co, Ai, Ru, Pt, u, Egg or other suitable materials), metal alloy (e.g., PdAg, PdRu, and/or other suitable materials), metal-containing materials (may also be known as al-like or metallic-like materials) (e.g., TiN, TaN, WN, WCN and/or other suitable materials), semiconductor compound (e.g., GaAs, CdS, CdSe, CdTe, GaN, and/or other suitable materials), or any combination thereof. In some embodiments, the conductive structures 208 of the conductive feature 206 are free from having hydroxyl groups at their surfaces.

Figure 4:
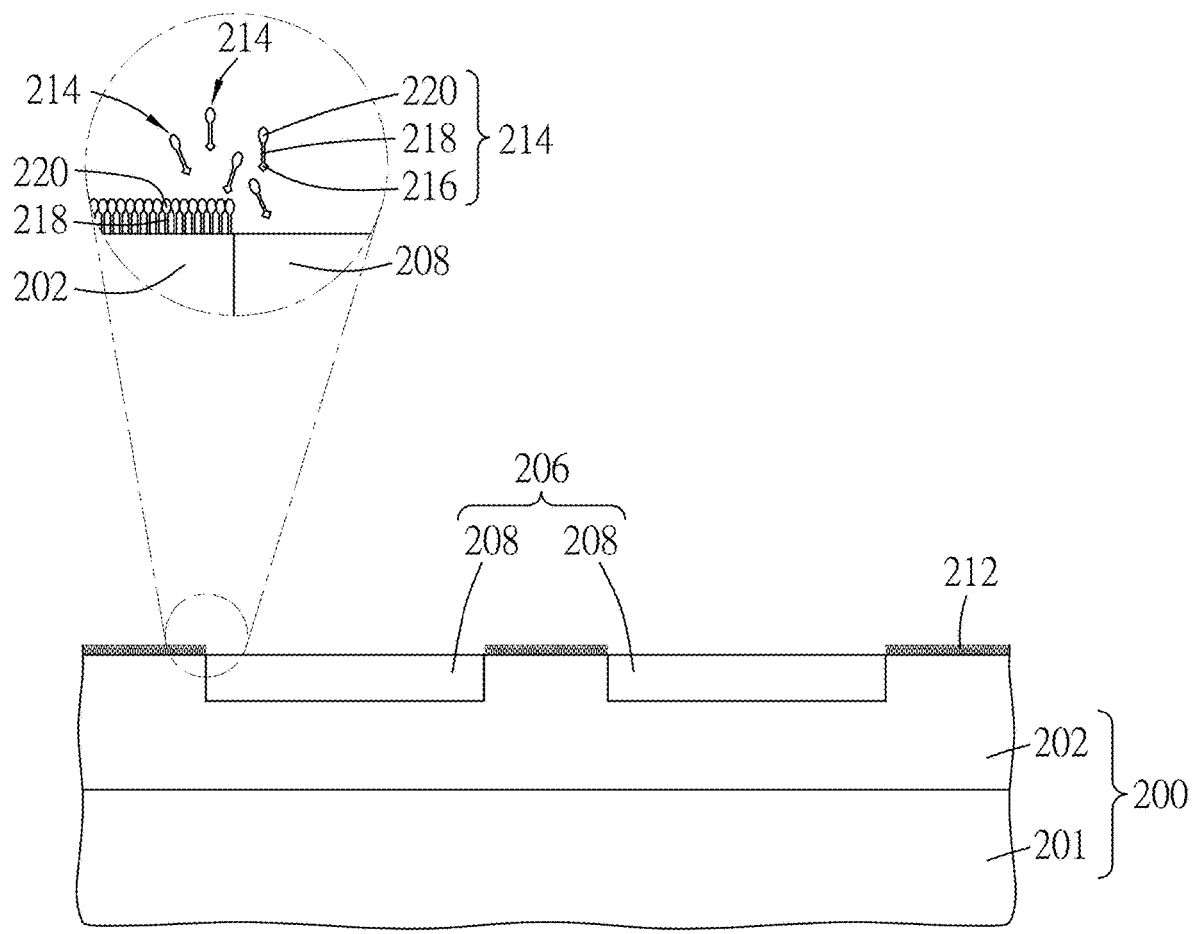

Referring to FIG. 1, the method 100 then proceeds to block 108, where a blocking layer is formed. Referring to FIG. 4, in some embodiments, the blocking layer 212 is selectively formed to cover the top surface 210 of the base layer 202 of the semiconductor structure 200 (see FIG. 3) without being formed on the conductive structures 208 of the conductive feature 206. That is, the blocking layer 212 is formed on the top surface 210 of the base layer 202 of the semiconductor structure 200 outside of the conductive structures 208 of the conductive feature 206, and the conductive structures 208 of the conductive feature 206 are not covered by (i.e., are exposed from) the blocking layer 212. In some embodiments, the blocking layer 212 may be a self-assembled monolayer (SAM) which is formed from a plurality of precursor molecules 214. Each of the precursor molecules 214 includes a head group 216 and a tail 218 connected to the head group 216. In some embodiments, each of the precursor molecules 214 may further include a functional group 220 that is connected to the tail 218 opposite to the head group 216. In some embodiments, the head group 216 of each of the precursor molecules 214 may include a silane group, a phosphonate group, COOH, —CH═CH$_2$, —C≡CH, —COCl, —CONH, CHO, other suitable groups, or any combination thereof. In some embodiments, the silane group may be un-substituted or substituted, and may be represented by the formula of SiX$_3$, X being a hydrolyzable group, e.g., H, alkoxy, acyloxy, halogen (e.g., Cl), amine and combinations thereof. In certain embodiments, the silane group may include —Si(OH)$_3$, —Si(OCH$_3$)$_3$, or —Si(OCH$_2$CH$_3$)$_3$. The phosphonate group may be represented by the formula of —POZ$_2$, Z being OH, alkoxy or any combination thereof. In certain embodiments, the phosphonate group may include —PO(OH)$_2$, —PO(OCH$_3$)$_2$, —PO(OCH$_2$CH$_3$), etc. In some embodiments, the precursor molecules 214 may be in liquid or gas form. The head group 216 of each of the precursor molecules 214 may be reacted with the hydroxyl groups at the top surface 210 of the base layer 202 of the semiconductor structure 200 (see FIG. 3) so as to form on the base layer 202, the blocking layer 212 (i.e., the self-assembled monolayer (SAM)) having the tails 218 and the functional groups 220. The head group 216 of each of the precursor molecules 214 may not be reacted with the conductive structures 208 of the conductive feature 206, thereby realizing selective formation of the blocking layer 212 on the top surface 210 of the base layer 202 of the semiconductor structure 200 but not on the conductive structures 208 of the conductive feature 206. In some embodiments, the tail 218 of each of the precursor molecules 214 may be a linear or branched long chain which includes alkyl, aromatic compounds, other suitable groups, or any combination thereof. In some embodiments, the functional group 220 of each of the precursor molecules 214 may include groups of —CH$_3$, —CF$_3$, —CH═CH$_2$, —C≡CH, —COOH, —OH, other suitable groups, or any combination thereof. In some embodiments, when the tail 218 of each of the precursor molecules 214 includes long chain alkyl, the terminal end of the long chain alkyl is CH$_3$ group, which serves as the functional group 220. In some embodiments, each of the precursor molecules 214 may be alkyltrichlorosilane (ATS) (e.g., octyitrichlorosilane (OTS)) or other suitable materials. In some embodiments, the number of carbon atoms of the tail 218 of each of the precursor molecules (i.e., 214 ATS) may range from eight (i.e., OTS) to eighteen (i.e., octadecyltrichlorosilane (ODTS)), but other range values are also within the scope of this disclosure. If the number of carbon atoms of the tail 218 of each of the precursor molecules 214 is too small, such as less than eight, the tails 218 of the precursor molecules 214 may not be properly organized into a uniform monolayer due to a lack of inter-molecular attraction between the tails 218. If the number of carbon atoms of the tail 218 of each of the precursor molecules 214 is too large, such as greater than eighteen, the tails 218 of the precursor molecules 214 may be bent and entangled, resulting in the tails 218 of the precursor molecules 214 not being properly organized into a uniform monolayer. In addition, in certain cases, the precursor molecules 214 having tails 218 with carbon atom number greater than eighteen may be in a solid form, which makes it hard to uniformly apply the precursor molecules 214 to the top surface 210 of the base layer 202 (see FIG. 3). In some embodiments, the thickness of the blocking layer 212 may range from about 1 nm (e.g., when the carbon atom number of the tail 218 of each of the precursor molecules 214 is eight) to about 3 nm (e.g., when the carbon atom number of the tail 218 of each of the precursor molecules 214 is eighteen), but other range values are also within the scope of this disclosure.

An example for forming the blocking layer 212 is now described. The semiconductor substrate 201, the base layer 202 and the conductive feature 206 may be immersed into a toluene solution which contains about 3 mM to about 7 mM (e.g., about 5 mM) of the precursor molecules 214 (e.g., OTS) for about 3 min to about 7 min (e.g., about 5 min). If the concentration of the precursor molecules 214 is too low, such as lower than about 3 mM, the blocking layer 212 may not be properly formed to cover the top surface 210 of the base layer 202 of the semiconductor structure 200 (see FIG. 3). If the concentration of the precursor molecules 214 is too high, such as greater than about 7 mM, the overall manufacturing cost may be increased. If the immersion time is too short, such as shorter than about 3 min, the blocking layer 212 may not be properly formed to cover the top surface 210 of the base layer 202 of the semiconductor structure 200. If the immersion time is too long, such as longer than about 7 min, the overall process time will be increased, and the overall manufacturing cost may be increased. After forming the blocking layer 212, the semiconductor structure 200 and the structures formed thereon may be sonicated, in sequence, i.e., in toluene for about 1 min to about 5 min (e.g., for about 3 min), in acetone for 1 min to about 5 min (e.g., for about 3 min), in acetic acid for about 3 min to about 7 min (e.g., for about 5 min), and in acetone for 1 min to about 5 min (e.g., for about 3 min) for removing unreacted precursor molecules 214 and any impurities (e.g., by-product), followed by drying the semiconductor structure 200 and the structures formed thereon. If the sonication time in each of the aforesaid sonication stage is too short, such as shorter than about 1 min (for toluene or acetone) or about 3 min (for acetic acid), the semiconductor structure 200 and the structures formed thereon may not be properly cleaned. If the sonication time in each sonication stage is too long, such as longer than about 5 min (for toluene or acetone) or about 7 min (for acetic acid), the overall process time will be increased, and the overall manufacturing cost may be increased.

Figure 5:
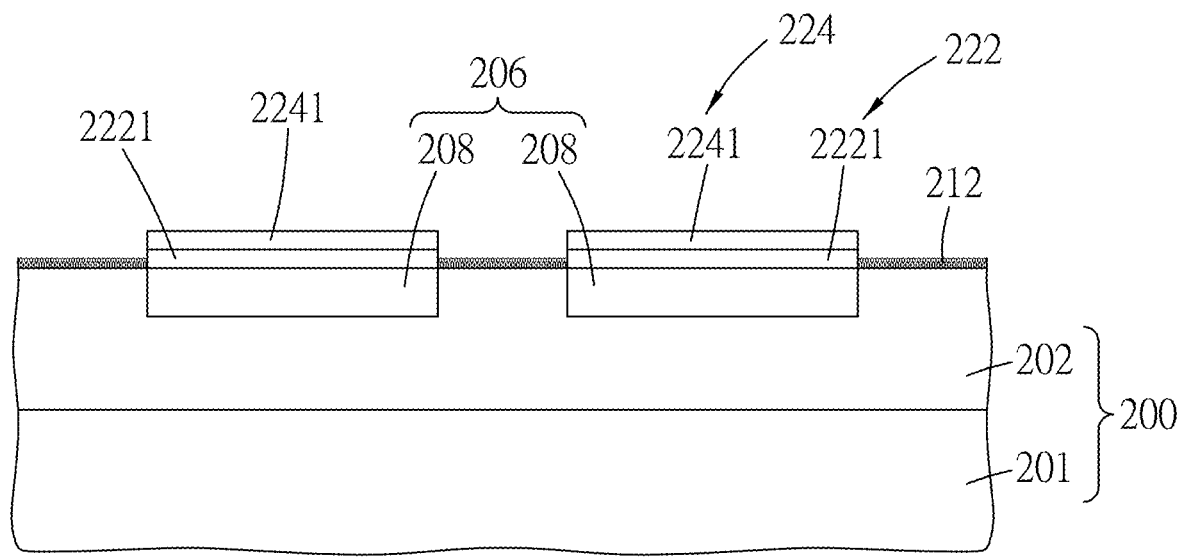

Referring to FIG. 1, the method 100 then proceeds to block 110, where a selectively-deposited layer is formed. Referring to FIG. 5, in some embodiments, the selectively-deposited layer 222 is selectively formed on the conductive feature 206 outside of the blocking layer 212 (i.e., the selectively-deposited layer 222 is not formed on the blocking layer 212). In some embodiments, the selectively-deposited layer 222 may include a plurality of selectively-deposited sub-layers 2221 that are respectively disposed on the conductive structures 208 of the conductive feature 206. In some embodiments, the selectively-deposited layer 222 may be formed by ALD, CVD, other suitable techniques, or any combination thereof. The materials used for forming the selectively-deposited layer 222 may be determined according to practical requirements. In some embodiments, when the semiconductor feature 300 (see FIG. 8) is a field-effect transistor (FET), the selectively-deposited layer 222 may be made of a high dielectric constant (high-k) material, such as perovskite-type materials ($CaTiO_3$, $PhTiO_3$, $BaTiO_3$, etc.), HfZrO, HfSiO, ZrSiO, $HfO_x$, other metal oxide, other suitable materials, or any combination thereof. In some embodiments, when the semiconductor feature 300 (see FIG. 8) is a ferroelectric memory device, the selectively-deposited layer 222 may be an active layer of the ferroelectric memory device, and may be made of a ferroelectric material, such as hafnium zirconium oxide (HZO), the abovementioned perovskite-type materials, other suitable materials, or any combination thereof.

In some embodiments, the functional groups 220 of the blocking layer 212 may be hydrophobic, such that a precursor material used for forming the selectively-deposited layer 222 would not be deposited on the blocking layer 212. In some embodiments, the selectively-deposited layer 222 may be grown by the following manner. Firstly, water vapor, water droplets, or other suitable substances are applied to the blocking layer 212 and the conductive feature 206. Since the functional groups 220 of the blocking layer 212 are hydrophobic, the water vapor would not rest upon or react with the blocking layer 212. Instead, the water vapor would react with the conductive structures 208 of the conductive feature 206 (e.g., would oxidize the conductive structures 208 of the conductive feature 206) to form hydroxyl groups on the conductive structures 208 of the conductive feature 206. Then, the precursor material for forming the selectively-deposited layer 222 is introduced. The precursor material would react with the hydroxyl groups on the conductive structures 208 of the conductive feature 206 to form a deposited layer (not shown) on the conductive structures 208 of the conductive feature 206 outside of the blocking layer 212. Afterwards, the water vapor is reintroduced to react with the deposited layer so as to form hydroxyl groups on the deposited layer, which may serve as reaction sites for reaction to be performed using subsequently introduced chemicals. Alternate introduction of the water vapor and the chemicals is repeated multiple times until the selectively-deposited sub-layers 2221 of the selectively-deposited layer 222 with desirable thickness are formed.

Referring to FIG. 1, the method 100 then proceeds to block 112, where a channel layer is formed. In some embodiments, the channel layer 224 includes a plurality of channel sub-layers 2241 that are respectively disposed on the selectively-deposited sub-layers 2221. In some embodiments, the channel sub-layers 2241 of the channel layer 224 may be formed by the same manner as with the selectively-deposited sub-layers 2221 of the selectively-deposited layer 222 as described above, and therefore the process of making the channel sub-layers 2241 of the channel layer 224 is not described for the sake of brevity. In some embodiments, the channel layer 224 may serve as a channel for the semiconductor feature 300 (see FIG. 8). In some embodiments, the channel layer 224 may be made of a suitable semiconductor or metal oxide, such as IGZO, InZnSnO, ZnO, InGaO, AlInGaZnO, InWO, InZnO, Ce-doped InTiO, InTiZnO, etc.

Figure 6:
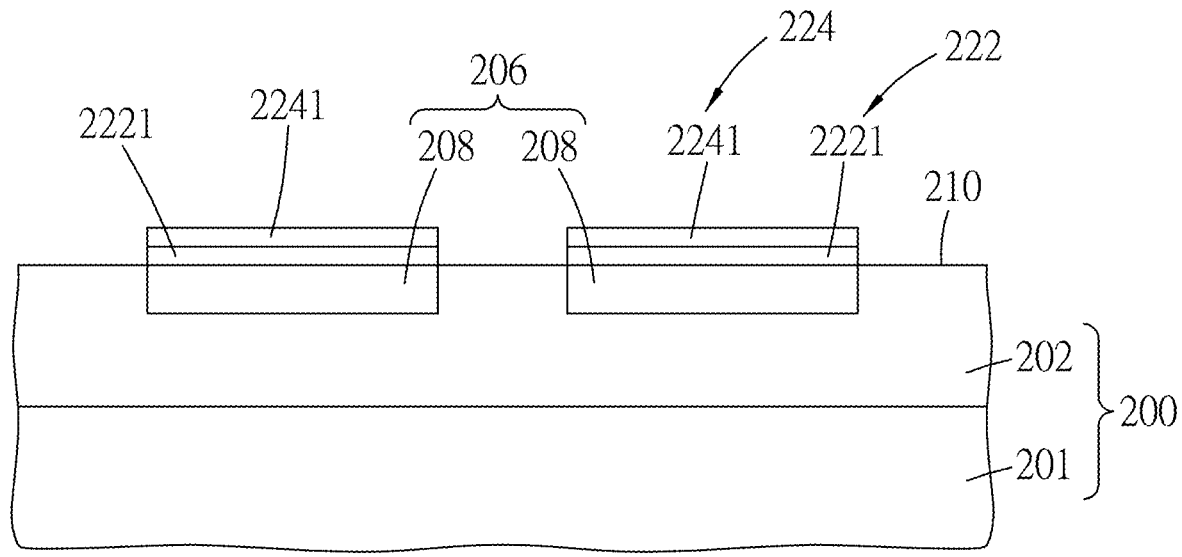

Referring to FIG. 1, the method 100 then proceeds to block 114, where the blocking layer is removed. Referring to FIG. 6, in some embodiments, the blocking layer 212 (see FIG. 5) may be removed by using oxygen ($O_2$) plasma treatment, ozone ($O_3$) plasma treatment, other suitable treatments, or any combination thereof. In some embodiments, the $O_2/O_3$ plasma treatment not only removes the blocking layer 212, but also fills the oxygen vacancies generated during the formation of the selectively-deposited layer 222 and the channel layer 224 with oxygen.

Figure 7:
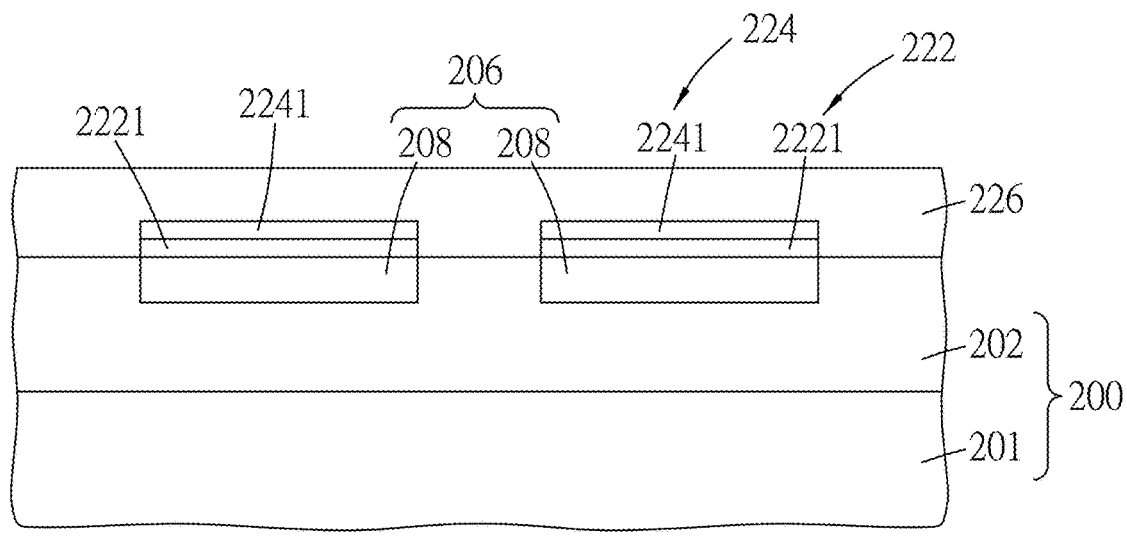

Referring to FIG. 1, the method 100 then proceeds to block 116, where a dielectric layer is formed. Referring to FIG. 7, in some embodiments, the dielectric layer 226 is formed on the top surface 210 of the base layer 202 and covers the selectively-deposited layer 222 and the channel layer 224. In some embodiments, the dielectric layer 226 may be formed by spin-on coating, CVD, ALD, other suitable techniques, or any combination thereof. In some embodiments, the dielectric layer 226 may include undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH), other suitable materials, or any combination thereof.

Figure 8:
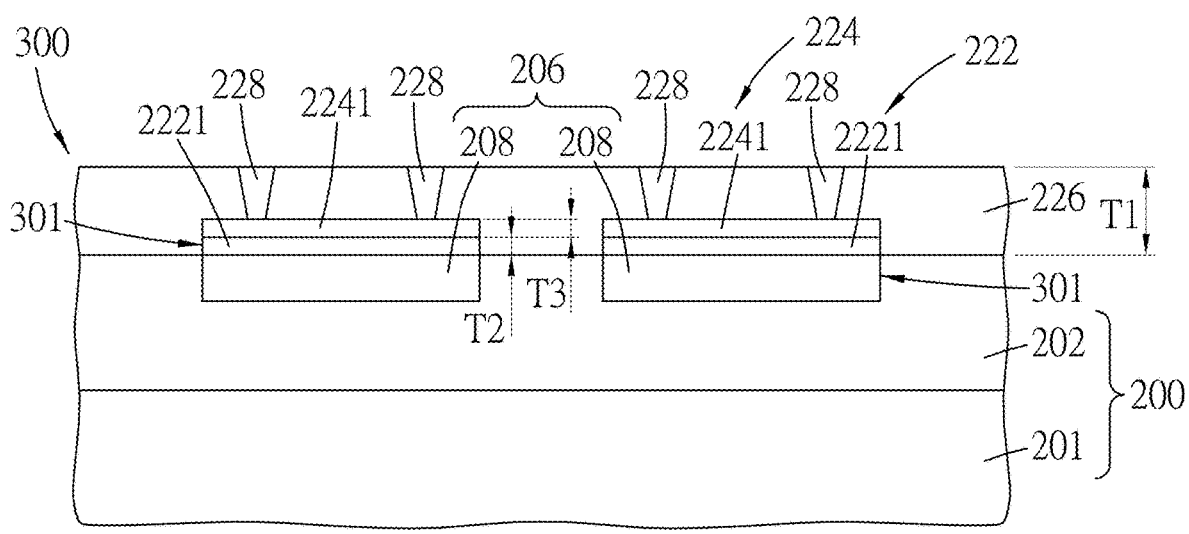

Referring to FIG. 1, the method 100 then proceeds to block 118, where a plurality of contact vias are formed. Referring to FIG. 8, in some embodiments, the contact vias 228 are formed in the dielectric layer 226 and are connected to the channel layer 224, thereby obtaining the semiconductor feature 300. In some embodiments, the contact vias 228 may be made of Al, Cu, W, Ti, Co, Ni, Ru, metal nitride (e.g., TiN, TaN, TaAlN, etc.), other suitable conductive materials, or any combination thereof. FIG. 8 schematically shows that two contact vias 228 are connected to one of the channel sub-layers 2241, while the other two of the contact vias 228 are connected to the other one of the channel sub-layers 2241. The number of the contact vias 228 may be changed according to practical requirements. In the embodiment shown in FIG. 8, there are two semiconductor devices 301, each of which includes one of the conductive structures 208 disposed in the base layer 202, one of the selectively-deposited sub-layers 2221 disposed in the dielectric layer 226 and connected to the conductive structure 208, one of the channel sub-layers 2241 disposed in the dielectric layer 226 and connected to the selectively-deposited sub-layer 2221, and two of the contact vias 228 disposed in the dielectric layer 226 and connected to the channel sub-layers 2241. When each of the semiconductor devices 301 is a field-effect transistor, the conductive structure 208 may serve as a gate structure, the selectively-deposited sub-layers 2221 may serve as a gate dielectric structure, the channel sub-layer 2241 may serve as a channel, and the two contact vias 228 may respectively serve as a source and a drain. Alternatively, when each of the semiconductor devices 301 is a ferroelectric memory device, the conductive structure 208 may serve as a gate structure, selectively-deposited sub-layers 2221 may serve as an active layer, the channel sub-layer 2241 may serve as a channel, and the two contact vias 228 may respectively serve as a source and a drain. In some embodiments, the dielectric layer 226 has a thickness (T1) which may range from about 10 nm to about 100 nm, but other range values are also within the scope of this disclosure. If the thickness (T1) of the dielectric layer 226 is too small, such as smaller than about 10 nm, the dielectric layer 226 may not properly cover the selectively-deposited layer 222 and the channel layer 224, and may not be thick enough for forming the contact vias 228. If the thickness (T1) of the dielectric layer 226 is too large, such as greater than about 100 nm, the overall dimension of the semiconductor feature 300 may be undesirably increased. In some embodiments, each of the selectively-deposited sub-layers 2221 has a thickness (T2) which may range from about 5 nm to about 20 nm, but other range values are also within the scope of this disclosure. If the thickness (T2) of each of the selectively-deposited sub-layers 2221 is too small, such as thinner than about 5 nm, leakage current may penetrate the selectively-deposited sub-layers 2221. If the thickness (T2) of each of the selectively-deposited sub-layers 2221 is too large, such as greater than about 20 nm, the overall dimension of the semiconductor feature 300 may be undesirably increased. In some embodiments, each of the channel sub-layer 2241 has a thickness (T3) which may range from about 1 nm to about 30 nm, but other range values are also within the scope of this disclosure. If the thickness (T3) of each of the channel sub-layer 2241 is too small, such as thinner than about 1 nm, there might not be enough space for carrier to flow therein, resulting in insufficient number of carriers. If the thickness (T3) of each of the channel sub-layer 2241 is too large, such as greater than about 30 nm, the overall dimension of the semiconductor feature 300 may be undesirably increased.

Figure 9:
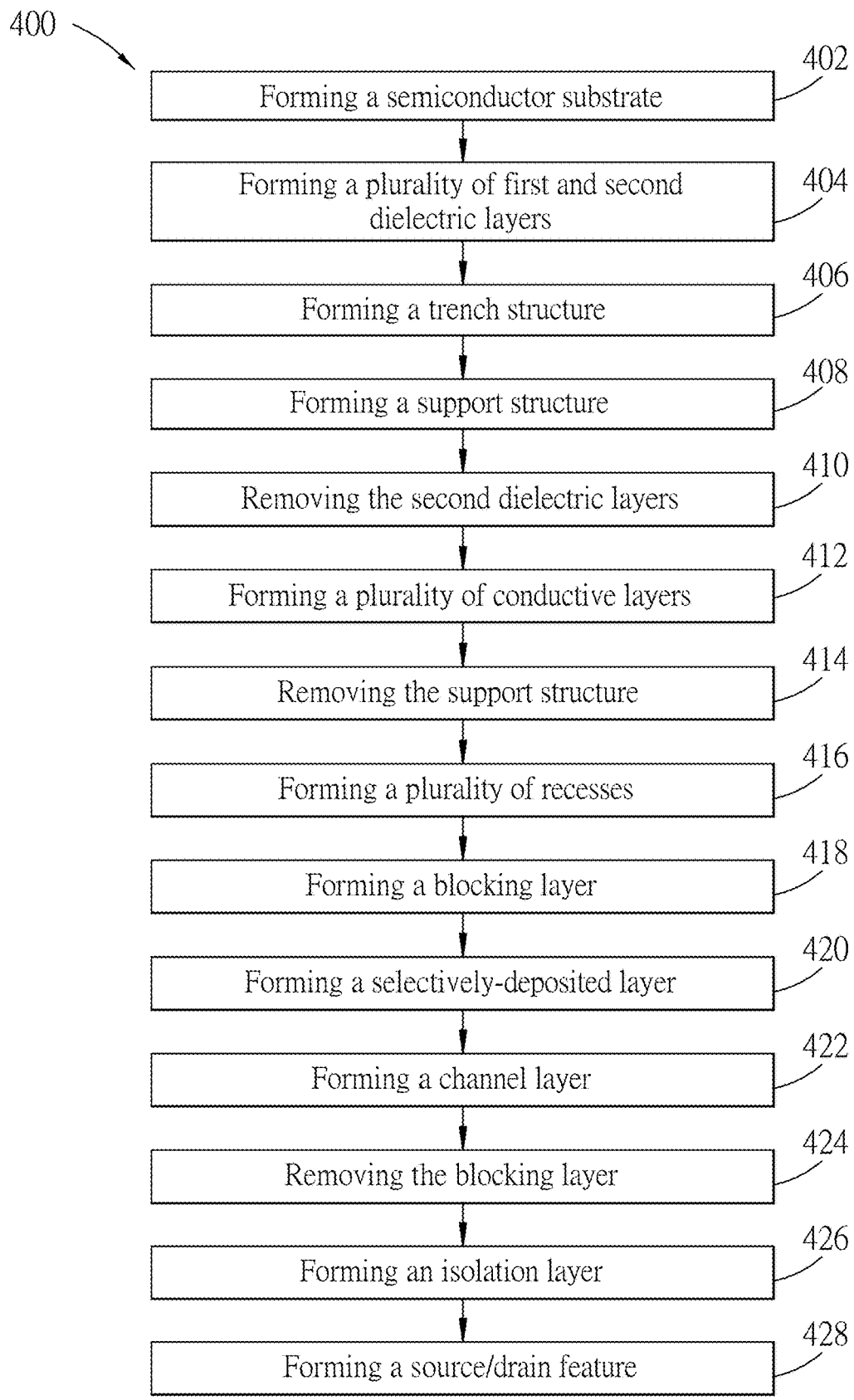
FIG. 9 is a flow diagram of another method for manufacturing another semiconductor feature in accordance with some embodiments.

FIG. 9 illustrates a method 400 for manufacturing a semiconductor feature 600 (see FIGS. 21 and 22) in accordance with some embodiments. FIGS. 10 to 19 are schematic views showing intermediate stages of the method 400 as depicted in FIG. 9. Additional steps which are not limited to those described in the method 400, can be provided before, after or during manufacturing of the semiconductor feature 600, and some of the steps described herein may be replaced by other steps or be eliminated. Similarly, additional features may be present in the semiconductor feature 600, and/or features present may be replaced or eliminated in additional embodiments.

Referring to FIG. 9, the method 400 begins at block 402, where a semiconductor substrate is formed. Referring to the example illustrated in FIG. 10, the semiconductor substrate 500 may be made of an elemental semiconductor, a compound semiconductor, other suitable materials, or any combination thereof. The elemental semiconductor may contain a single species of atoms, such as Si, Ge or other suitable materials, e.g., other elements from group 14 of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or the like. In some embodiments, the composition of the compound semiconductor including the aforesaid elements may change from one ratio at one location to another ratio at another location (i.e., the compound semiconductor may have a gradient composition).

Figure 10:
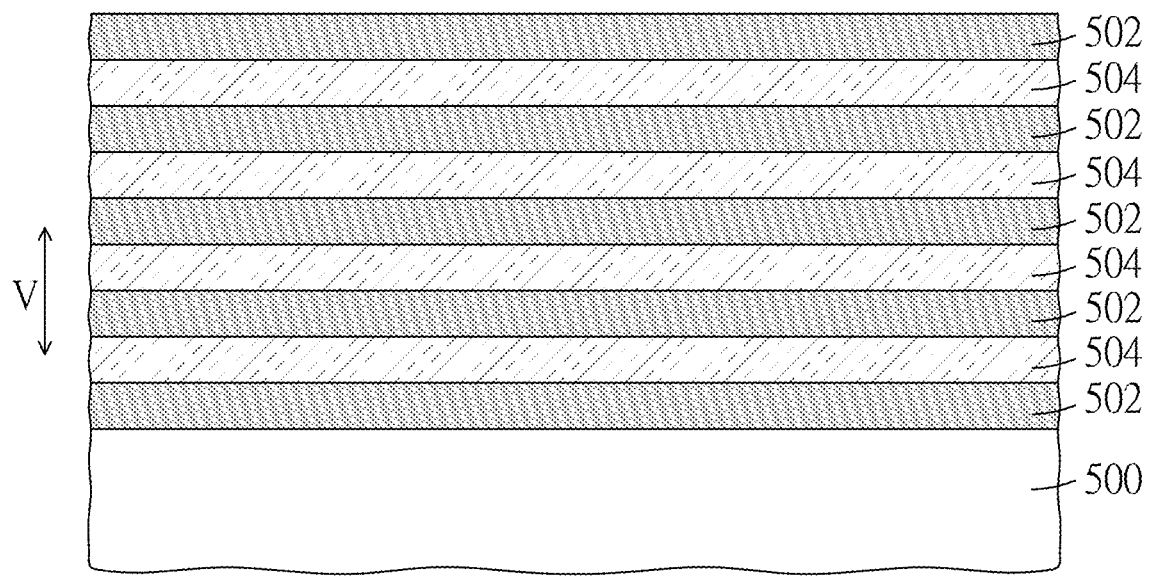
FIGS. 10 to 22 illustrate intermediate stages of the method as depicted in FIG. 9.

Referring to FIG. 9, the method 400 then proceeds to block 404, where a plurality of first and second dielectric layers are formed. Referring to FIG. 10, in some embodiments, the first and second dielectric layers 502, 504 are alternatingly stacked on the semiconductor substrate 500, for example, in a vertical direction (V) which may be substantially perpendicular to the semiconductor substrate 500. In some embodiments, the first dielectric layers 502 may be made of an oxide-based material, such as $SiO_x$ or other suitable materials, and the second dielectric layers 504 may be made of a nitride-based material, such as $Si_3N_4$ or other suitable materials. The number of the first and second dielectric layers 502, 504 may be determined according to practical requirements.

Figure 11:
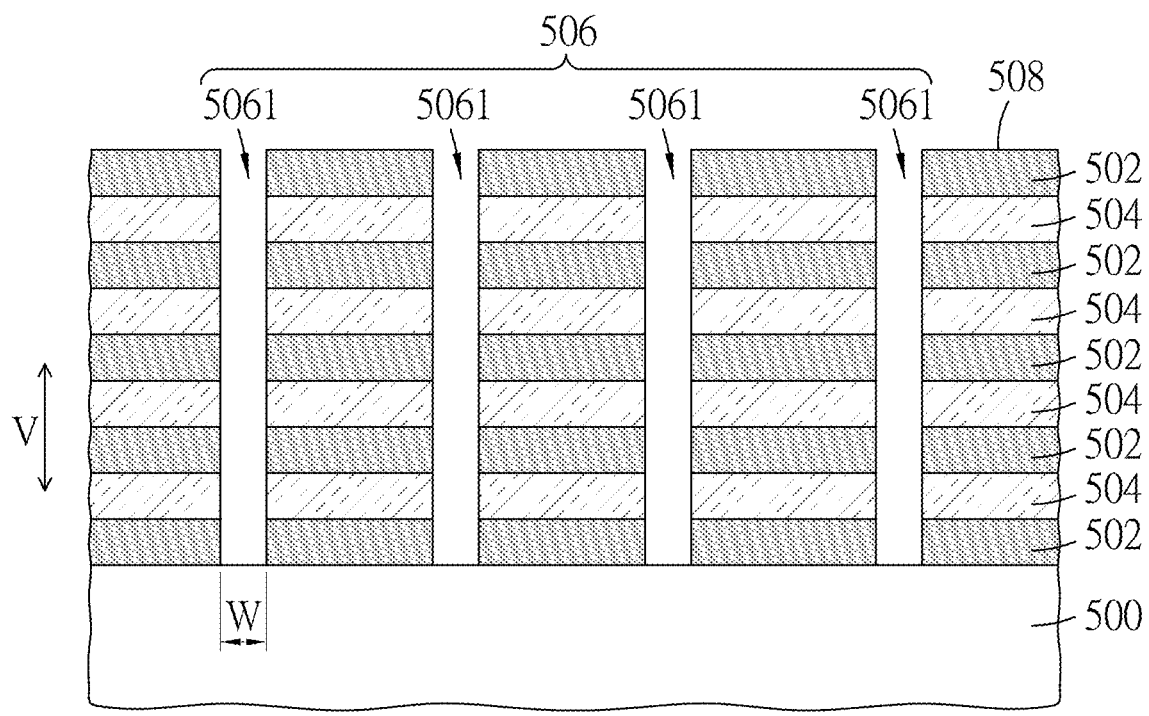

Referring to FIG. 9, the method 400 then proceeds to block 406, where a trench structure is formed. Referring to FIG. 11, in some embodiments, the trench structure 506 includes a plurality of trenches 5061 that are spaced apart from each other, and each of the trenches 5061 penetrates the first and second dielectric layers 502, 504 in the vertical direction (V) and terminates at the semiconductor substrate 500. In some embodiments, the trenches 5061 may be formed by plasma dry etching, other suitable techniques, or any combination thereof. In some embodiments, each of the trenches 5061 of the trench structure 506 has a width (W) ranging from about 40 nm to about 80 nm, but other range values are also within the scope of this disclosure. If the width (W) is too small, such as smaller than about 40 nm, it may be difficult to uniformly deposit materials in the trenches 5061 in subsequent process. If the width (W) is too large, such as greater than about 80 nm, the overall dimension of the semiconductor feature 600 (see FIG. 22) may be increased, which contradicts the trend of device miniaturization.

Figure 12:
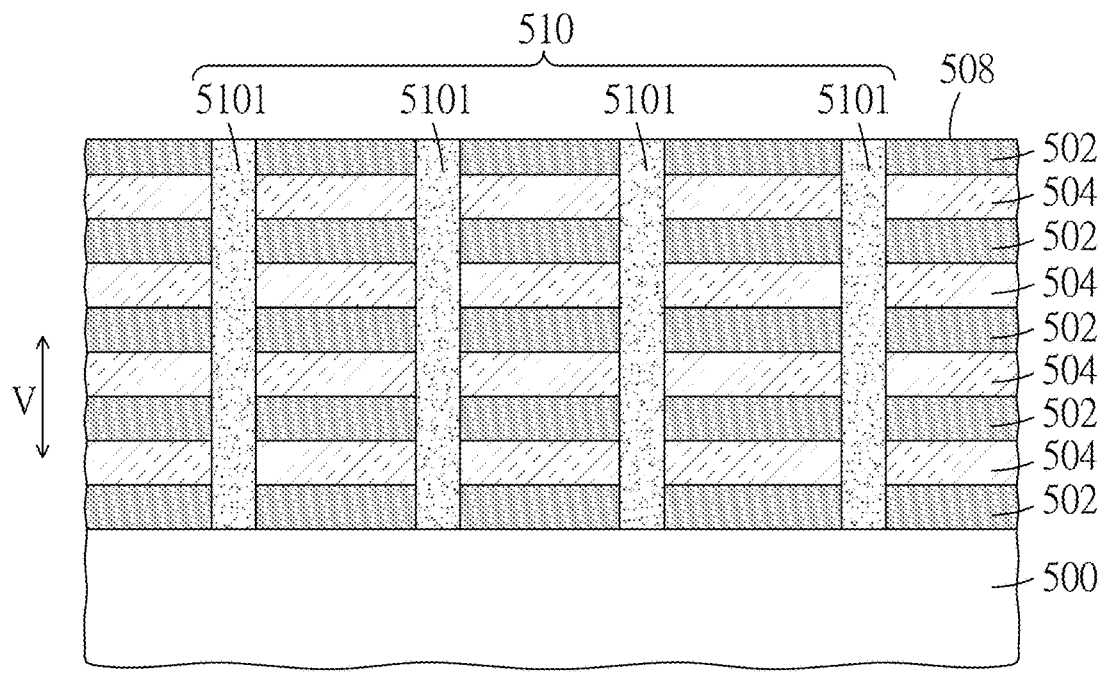

Referring to FIG. 9, the method 400 then proceeds to block 408, where a support structure is formed. Referring to FIG. 12, in some embodiments, the support structure 510 includes a plurality of support segments 5101 that are respectively formed in the trenches 5061 (see FIG. 11). In some embodiments, the support segments 5101 may be made of amorphous silicon, other suitable materials, or any combination thereof. In some embodiments, the support segments 5101 may be formed using CVD, PVD, ALD, other suitable techniques, or any combination thereof. In some embodiments, a suitable material for forming the support segments 5101 may be deposited in the trenches 5061 and on a top surface 508 of the topmost first dielectric layer 502 (see FIG. 11), followed by removing the material above the top surface 508 of the topmost first dielectric layer 502 by CMP, dry etching, other suitable techniques, or any combination thereof. In some embodiments, a portion of the topmost first dielectric layer 502 may be removed during the process of removing the material above the top surface 508.

Figure 13:
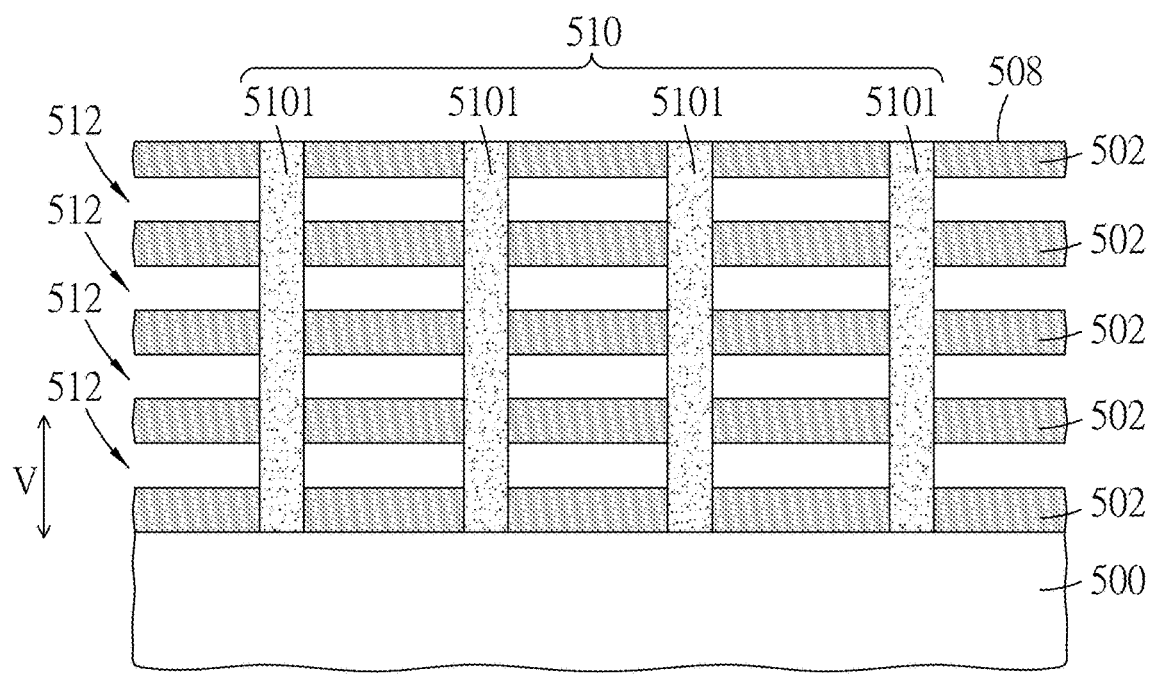

Referring to FIG. 9, the method 400 then proceeds to block 410, where the second dielectric layers are removed. Referring to FIG. 13, in some embodiments, the second dielectric layers 504 (see FIG. 12) are removed to form a plurality of spaces 512 with the first dielectric layers 502 substantially unetched. In some embodiments, such removal process may be conducted using phosphoric acid, other suitable etchants, or any combination thereof. In some embodiments, the first dielectric layers 502 may be supported by the support segments 5101 of the support structure 510.

Figure 14:
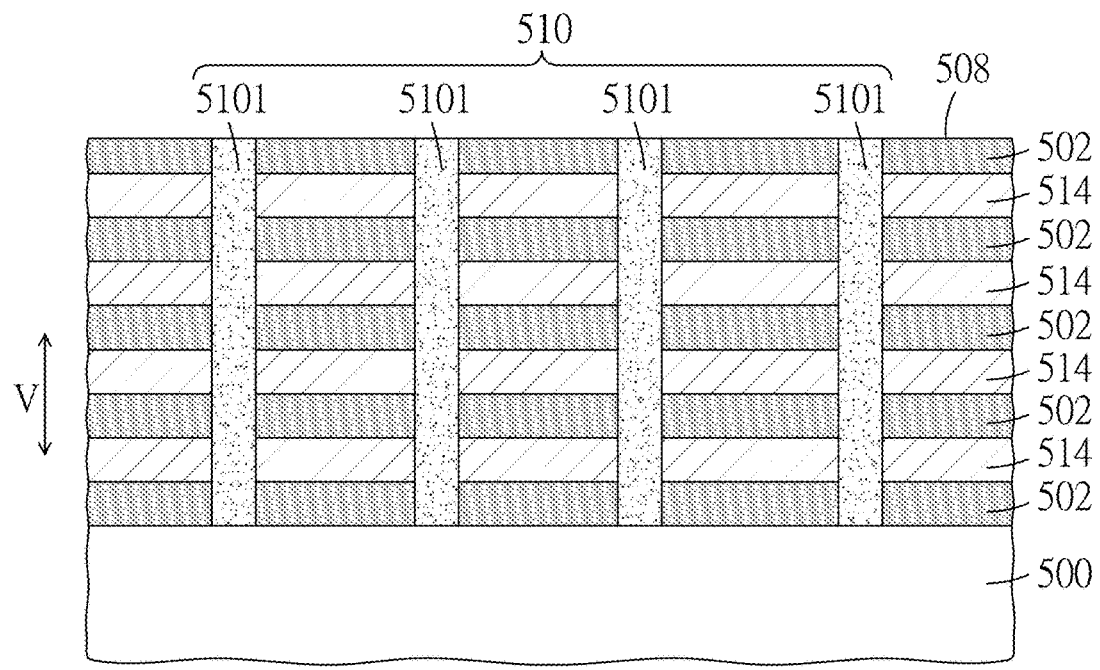

Referring to FIG. 9, the method 400 then proceeds to block 412, where a plurality of conductive layers are formed. Referring to FIG. 14, in some embodiments, the conductive layers 514 are formed to respectively fill the spaces 512 (see FIG. 13) by bringing the entire structure shown in FIG. 13 to be in contact with a suitable precursor material which enters the spaces 512 so as to obtain the conductive layers 514 filling the spaces 512. In some embodiments, the conductive layer may also be formed on the top surface 508 of the topmost first dielectric layer 502, and may be removed by CMP, dry etching, other suitable techniques, or any combination thereof. In some embodiments, a portion of the topmost first dielectric layer 502 may be removed during the process of removing the conductive layer on the top surface 508. In some embodiments, the conductive layers 514 may be made of polysilicon (doped or undoped), silicide (TiSi, CoSi, SiGe, etc.), oxide semiconductor (InZnO, InGaZnO, etc.), metal/metal nitride (Al, Cu, W, Ti, Co, Ni, Ru, TiN, TaN, TaAlN, etc.), other suitable materials, or any combination thereof. The conductive layers 514 may be formed using CVD, ALD, electroplating, electroless plating, other suitable techniques, or any combination thereof.

Figure 15:
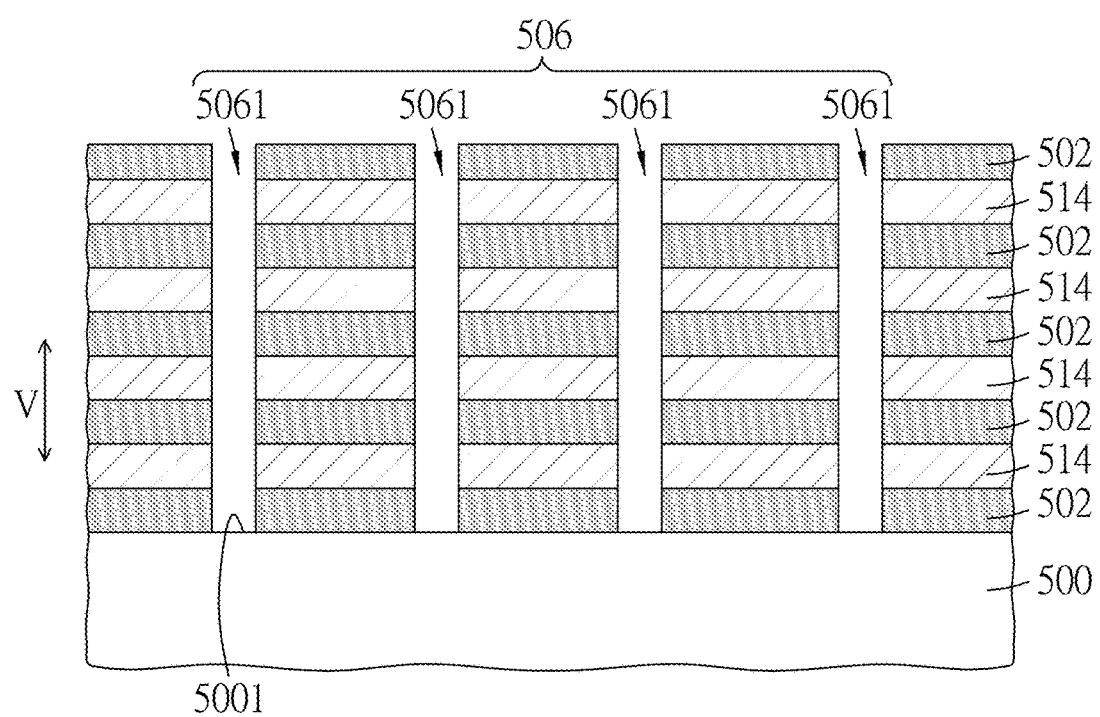

Referring to FIG. 9, the method 400 then proceeds to block 414, where the support structure is removed. Referring to FIG. 15, in some embodiments, the support segments 5101 of the support structure 510 (see FIG. 14) are removed using potassium hydroxide, other suitable chemicals, or any combination thereof with the first dielectric layers 502 and the conductive layers 514 substantially unetched, thereby exposing the trenches 5061 of the trench structure 506.

Figure 16:
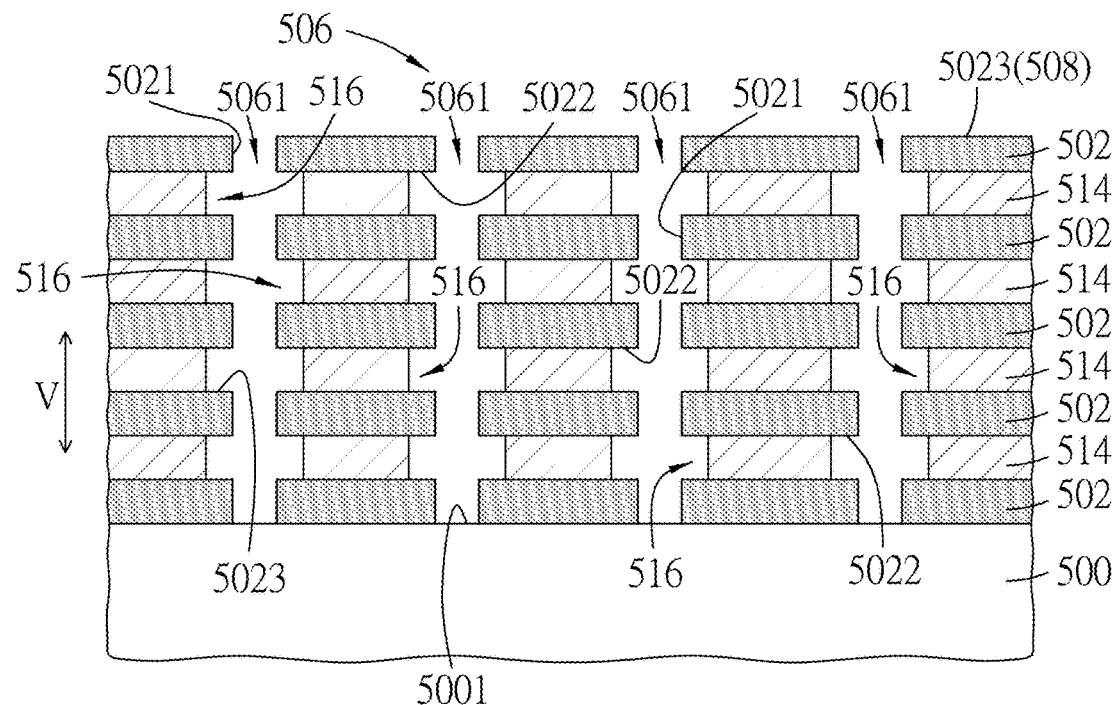

Referring to FIG. 9, the method 400 then proceeds to block 416, where a plurality of recesses are formed. Referring to FIG. 16, in some embodiments, the conductive layers 514 are etched at side portions thereof to form a plurality of recesses 516 using wet etching, plasma dry etching, other suitable techniques, or any combination thereof with the first dielectric layers 502 substantially unetched. That is, side portions of each of the conductive layers 514 that face the corresponding trenches 5061 are removed to form two of the recesses 516 at two opposite sides of each of the conductive layers 514 so that a part of a surface of a corresponding one of the first dielectric layers 502 that is adjacent to the each of the conductive layers 514 is exposed. The width of each of the recesses 516 may be determined according to practical requirements.

Figure 17:
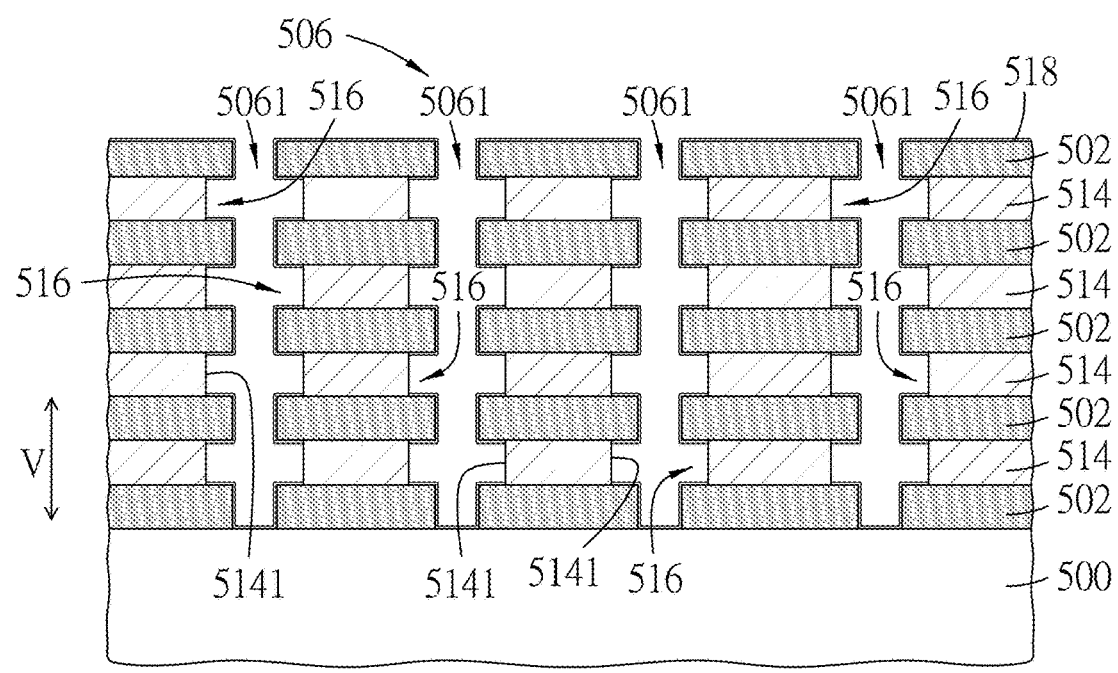

Referring to FIG. 9, the method 400 then proceeds to block 418, where a blocking layer is formed. Referring to FIG. 17, in some embodiments, the blocking layer 518 is selectively formed to cover the first dielectric layers 502 outside of the conductive layers 514, i.e., an exposed portion of the first dielectric layers 502 which is not in contact with the conductive layers 514. In some embodiments, two side surfaces 5021, a lower surface 5022 and an upper surface 5023 (including the top surface 508 of the topmost first dielectric layer 502) of each of the first dielectric layers 502 outside of the conductive layers 514 (see FIG. 16) are covered by the blocking layer 518, and two side surfaces 5141 of each of the conductive layers 514 that are exposed from the corresponding recesses 516 are not covered by (i.e., exposed from) the blocking layer 518. In some embodiments, a top surface 5001 of the semiconductor substrate 500 (see FIG. 16) exposed from the trench structure 506 may be covered by the blocking layer 518. However, in other embodiments, the top surface 5001 of the semiconductor substrate 500 may not be covered by the blocking layer 518. In some embodiments, each of the side surfaces 5021 of each of the first dielectric layers 502 may be substantially perpendicular to the semiconductor substrate 500, and/or may extend substantially along the vertical direction (V). In some embodiments, the blocking layer 518 may be a self-assembled monolayer (SAM) which is formed from a plurality of precursor molecules (not shown, but similar to precursor molecules 214 shown in FIG. 4). Each of the precursor molecules includes a head group and a tail connected to the head group. In some embodiments, each of the precursor molecules may further include a functional group that is connected to the tail opposite to the head group. In some embodiments, the head group of each of the precursor molecules may include a silane group, a phosphonate group, COOH, —CH=CH$_2$, —C≡CH, —COCl, —CONH, CHO, other suitable groups, or any combination thereof. The silane group may be un-substituted or substituted, and may be represented by the formula of SiX$_3$, X being a hydrolyzable group, e.g., H, alkoxy, acyloxy, halogen (e.g., Cl), amine and combinations thereof. In certain embodiments, the silane group may include —Si(OH)$_3$, —Si(OCH$_3$)$_3$, or —Si(OCH$_2$CH$_3$)$_3$. The phosphonate group may be represented by the formula of —POZ$_2$, Z being OH, alkoxy or combinations thereof. In certain embodiment, the phosphonate group may include —PO(OH)$_2$, —PO(OCH$_3$)$_2$, —PO(OCH$_2$CH$_3$)$_2$, etc. In some embodiments, the precursor molecules may be in liquid or gas form. The head group of each of the precursor molecules may be reacted with the hydroxyl groups on the first dielectric layers 502 (i.e., the hydroxyl groups on the side surfaces 5021, the lower surface 5022 and the upper surface 5023 (including the top surface 508 of the topmost first dielectric layer 502) of each of the first dielectric layers 502 outside of the conductive layers 514) so as to form the self-assembled monolayer (SAM) having the tails and the functional groups. The head groups of the precursor molecules may not be bonded to the side surfaces 5141 of the conductive layers 514, thereby realizing selective formation of the blocking layer 518 on the first dielectric layers 502 but not on the conductive layers 514. In some embodiments, the tail of each of the precursor molecules may be a linear or branched long chain which includes alkyl, aromatic compounds, other suitable groups, or any combination thereof. In some embodiments, the functional group of each of the precursor molecules may include groups of —CH$_3$, —CF$_3$, —CH=CH$_2$, —C≡CH, —COOH, —OH, other suitable groups, or any combination thereof. In some embodiments, when the tail of each of the precursor molecules includes long chain alkyl, the terminal end of the long chain alkyl is CH$_3$ group, which serves as the functional group. In some embodiments, each of the precursor molecules 214 may be alkyltrichlorosilane (ATS) (e.g., octyltrichlorosilane (OTS)) or other suitable materials. In some embodiments, the number of carbon atoms of the tail of each of the precursor molecules (i.e., ATS) may range from eight (i.e., OTS) to eighteen (i.e., octadecyltrichlorosilane (ODTS)), but other range values are also within the scope of this disclosure. If the number of carbon atoms of the tail of each of the precursor molecules is too small, such as less than eight, the tails of the precursor molecules may not be properly organized into a uniform monolayer due to a lack of inter-molecular attraction between the tails. If the number of carbon atoms of the tail of each of the precursor molecules is too large, such as greater than eighteen, the tails of the precursor molecules may be bent and entangled, resulting in the tails of the precursor molecules not being properly organized into a uniform monolayer. In addition, in certain cases, the precursor molecules having tails with carbon atom number greater than eighteen may be in a solid form, which makes it hard to uniformly apply the precursor molecules into the trenches 5061. In some embodiments, the thickness of the blocking layer 518 may range from about 1 nm (e.g., when the carbon atom number of the tail of each of the precursor molecules is eight) to about 3 nm (e.g., when the carbon atom number of the tail of each of the precursor molecules is eighteen), but other range values are also within the scope of this disclosure.

The detailed process for forming the blocking layer 518 and a cleaning process performed after forming the blocking layer 518 may be similar to the process for forming the blocking layer 212 (see FIG. 4) and the cleaning process performed after forming the blocking layer 212, respectively, as described above, with adjustments if necessary. Therefore, these processes are not elaborated herein for the sake of brevity.

Figure 18:
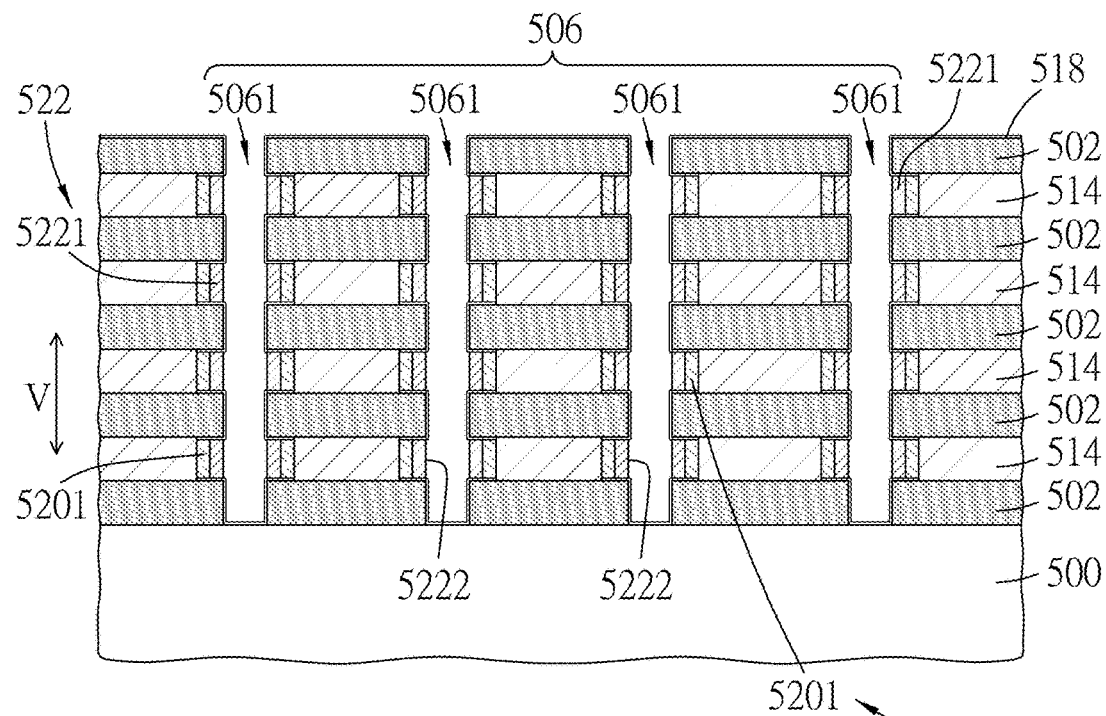

Referring to FIG. 9, the method 400 then proceeds to block 420, where a selectively-deposited layer is formed. Referring to FIG. 18, in some embodiments, the selectively-deposited layer 520 is selectively formed on the conductive layers 514 without being formed on the blocking layer 518 (i.e., the selectively-deposited layer 520 is formed outside of the blocking layer 518). In some embodiments, the selectively-deposited layer 520 includes a plurality of selectively-deposited sub-layers 5201, each of which is disposed on a corresponding one of the side surfaces 5141 of a corresponding one of the conductive layers 514. In some embodiments, the selectively-deposited layer 520 may be made of a ferroelectric material, such as HZO, $CaTiO_3$, $PbTiO_3$, $BaTiO_3$, other suitable materials, or any combination thereof. In some embodiments, the selectively-deposited sub-layers 5201 of the selectively-deposited layer 520 may be formed by ALD, CVD, other suitable techniques, or any combination thereof.

Referring to FIG. 9, the method then proceeds to block 422, where a channel layer is formed. Referring to FIG. 18, in some embodiments, the channel layer 522 is selectively formed on the selectively-deposited layer 520 without being formed on the blocking layer 518 (i.e., the channel layer 522 is formed outside of the blocking layer 518). In some embodiments, the channel layer 522 includes a plurality of channel sub-layers 5221 that are respectively formed on the selectively-deposited sub-layers 5201 of the selectively-deposited layer 520. In some embodiments, each of the channel sub-layers 5221 has a side surface 5222 that is substantially flush with a corresponding one of the side surfaces 5021 of a corresponding one of the first dielectric layers 502 (see FIG. 16). In some embodiments, the channel layer 522 may be made of a suitable semiconductor or metal oxide, such as IGZO, InZnSnO, ZnO, InGaO, AlInGaZnO, InWO, InZnO, Ce-doped InTiO, InTiZnO, etc. In some embodiments, the selective deposition of the selectively-deposited layer 520 and the channel layer 522 may be achieved by alternating the introduction of water vapor and precursor materials as described in the aforesaid embodiments.

Figure 19:
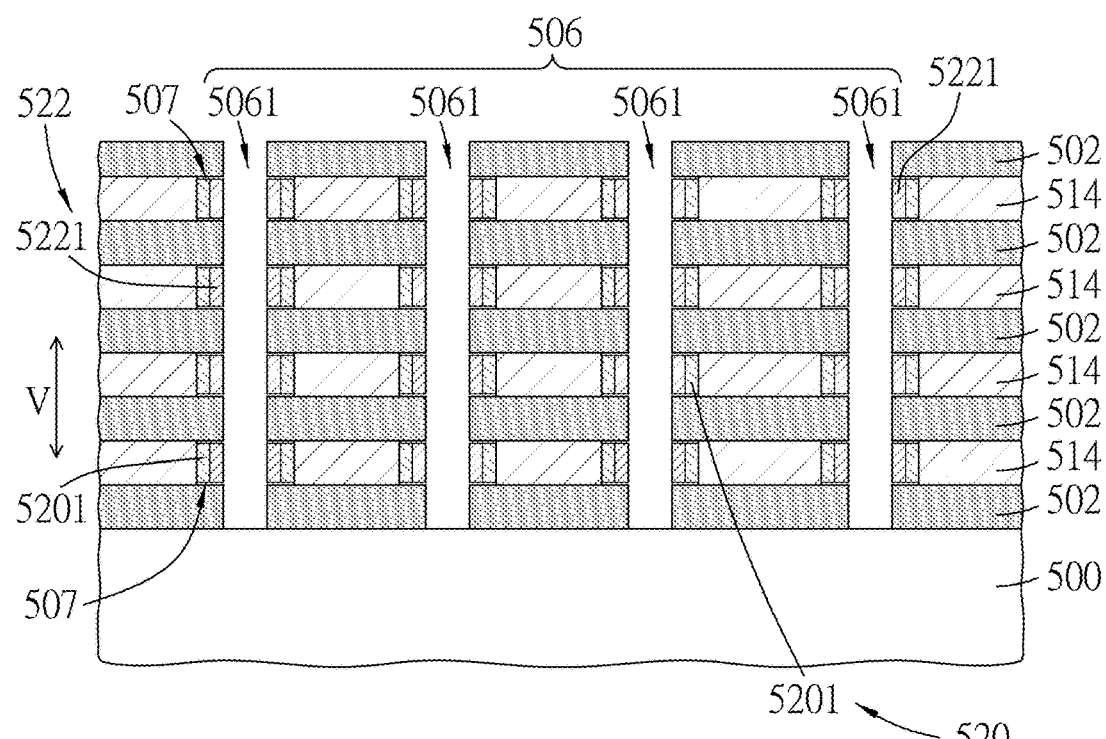

Referring to FIG. 9, the method 400 then proceeds to block 424, where the blocking layer is removed. Referring to FIG. 19, in some embodiments, the blocking layer 518 (see FIG. 18) may be removed by using oxygen ($O_2$) plasma treatment, ozone ($O_3$) plasma treatment, other suitable treatments, or any combination thereof, thereby leaving a plurality of gaps 507. For each of the selectively-deposited sub-layers 5201 and a corresponding one of the channel sub-layers 5221 connected thereto, two of the gaps 507 are respectively located thereabove and therebelow. In some embodiments, the $O_2$/$O_3$ plasma treatment not only removes the blocking layer 518, but also fills the oxygen vacancies generated during the formation of the selectively-deposited layer 520 and the channel layer 522 with oxygen.

Figure 20:
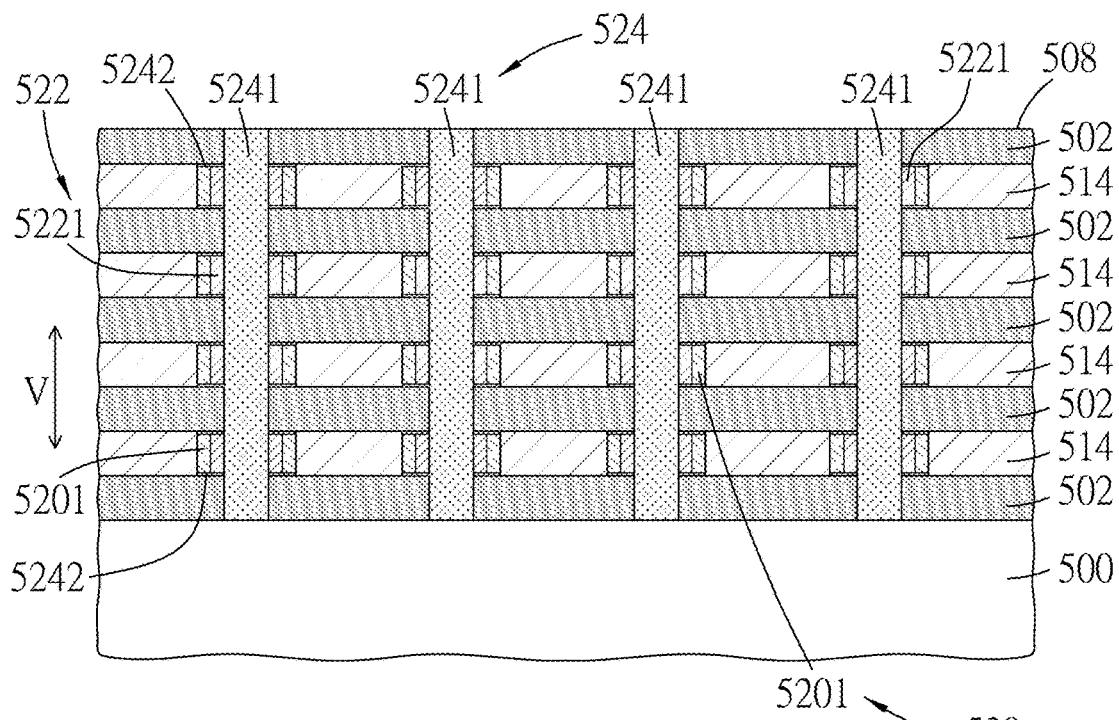

Referring to FIG. 9, the method 400 then proceeds to block 426, where an isolation layer is formed. Referring to FIG. 20, in some embodiments, the isolation layer 524 is formed to fill the trench structure 506 (see FIG. 19). In some embodiments, the isolation layer 524 includes a plurality of isolation sub-layers 5241 that respectively fill the trenches 5061 of the trench structure 506 (see FIG. 19), and a plurality of side portions 5242 that respectively fill the gaps 507 (see FIG. 19). In some embodiments, the isolation layer 524 may be made of a silicon oxide-based material, other suitable materials, or any combination thereof. In some embodiments, the isolation layer 524 may be formed by depositing (using ALD, CVD, PVD, other suitable techniques, or any combination thereof) an isolation material to fill the trenches 5061 of the trench structure 506 and on the top surface 508 of the topmost first dielectric layer 502, followed by removing the isolation material above the top surface 508 of the topmost first dielectric layer 502, thereby obtaining the isolation layer 524. In some embodiments, a top portion of the topmost first dielectric layer 502 may be removed during the removal process. In some embodiments, each of the isolation sub-layers 5241 may extend along a first direction (X1) (see FIG. 21) that is substantially parallel to the semiconductor substrate 500 and that is substantially perpendicular to the vertical direction (V), and the isolation sub-layers 5241 may be separated from each other along a second direction (X2) (see FIG. 21) that is substantially perpendicular to the first direction (X1) and the vertical direction (V). In some embodiments, each of the selectively-deposited sub-layers 5201 may extend along the first direction (X1), and adjacent two of the selectively-deposited sub-layers 5201 are separated by a corresponding one the first dielectric layers 502 along the vertical direction (V) (i.e., the adjacent two of the selectively-deposited sub-layers 5201 are separated from each other along the vertical direction (V)). In some embodiments, each of the channel sub-layers 5221 extends along the first direction (X1), and adjacent two of the channel sub-layers 5221 are separated by a corresponding one of the first dielectric layers 502 along the vertical direction (V) (i.e., the adjacent two of the channel sub-layers 5221 are separated from each other along the vertical direction (V)).

Figure 21:
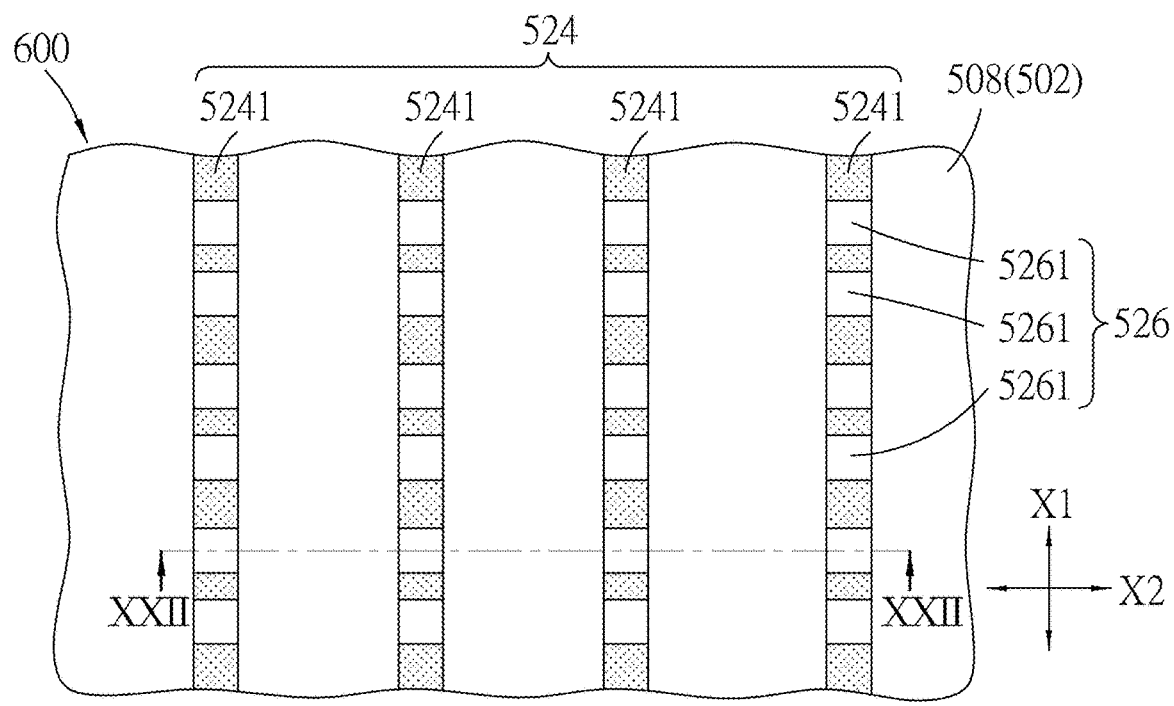
Figure 22:
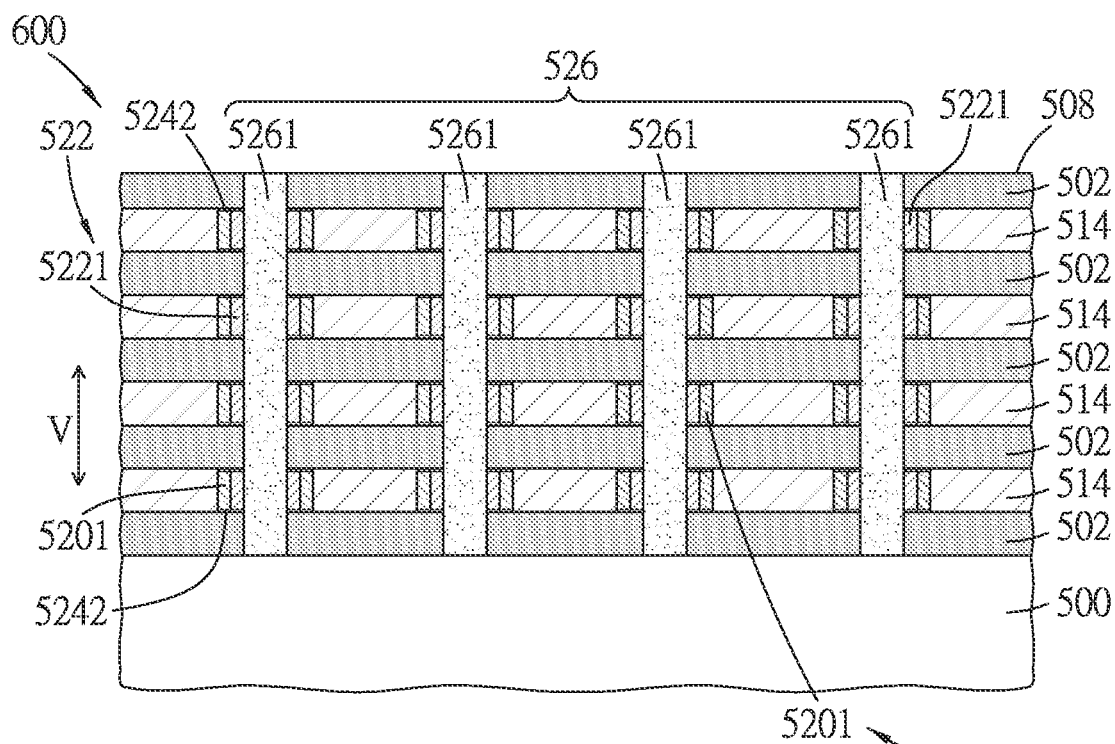

Referring to FIG. 9, the method 400 then proceeds to block 428, where a source/drain feature is formed. FIG. 21 is a top view of the semiconductor feature 600, and FIG. 22 is a schematic sectional view taken from line XXII-XXII of FIG. 21. In some embodiments, the source/drain feature 526 is formed in the isolation layer 524, and is electrically connected to the channel layer 522, thereby obtaining the semiconductor feature 600. In some embodiments, the source/drain feature 526 includes a plurality of source/drain segments 5261, each of which is formed in a corresponding one of the isolation sub-layers 5241 of the isolation layer 524 and is electrically connected to corresponding ones of the channel sub-layers 5221 of the channel layer 522. For example, as shown in FIGS. 21 and 22, each of the source/drain segments 5261 of the source/drain feature 526 may be electrically connected to eight of the channel sub-layers 5221 of the channel layer 522. In some embodiments, the selectively-deposited sub-layers 5201 are separated from each other, each of the selectively-deposited sub-layers 5201 is connected to a corresponding one of the conductive layers 514, the channel sub-layers 5221 are separated from each other, and each of the channel sub-layers 5221 is connected to (i.e., formed between) a respective one of the selectively-deposited sub-layers 5201 and corresponding ones of the source/drain segments 5261 (e.g., in some embodiments, six of the source/drain segments 5261 are formed in one isolation sub-layer 5241 as illustrated in FIGS. 21 and 22). In some embodiments, the source/drain feature 526 may be made of polysilicon (doped or undoped), silicide (TiSi, CoSi, SiGe, etc.), oxide semiconductor (InZnO, InGaZnO, etc.), metal/metal nitride (Al, Cu, W, Ti, Co, Ni, Ru, TiN, TaN, TaAlN, etc.), other suitable materials, or any combination thereof.

Figure 23:
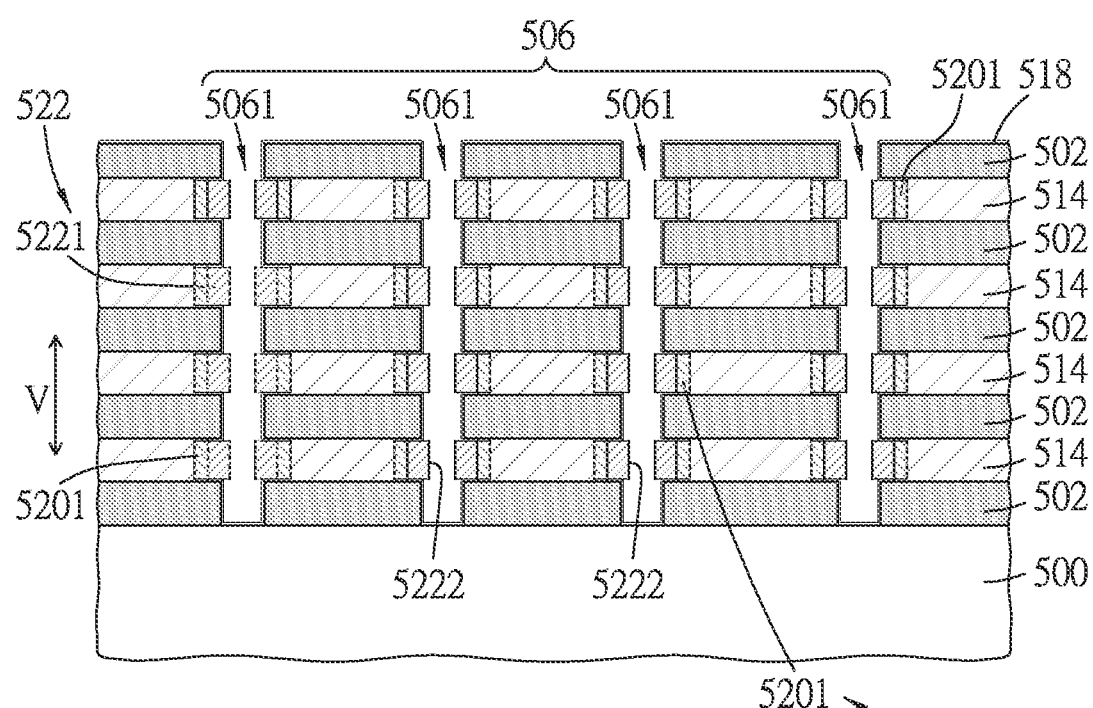
FIGS. 23 to 31 illustrate intermediate stages for manufacturing semiconductor features in accordance with some embodiments.
Figure 24:
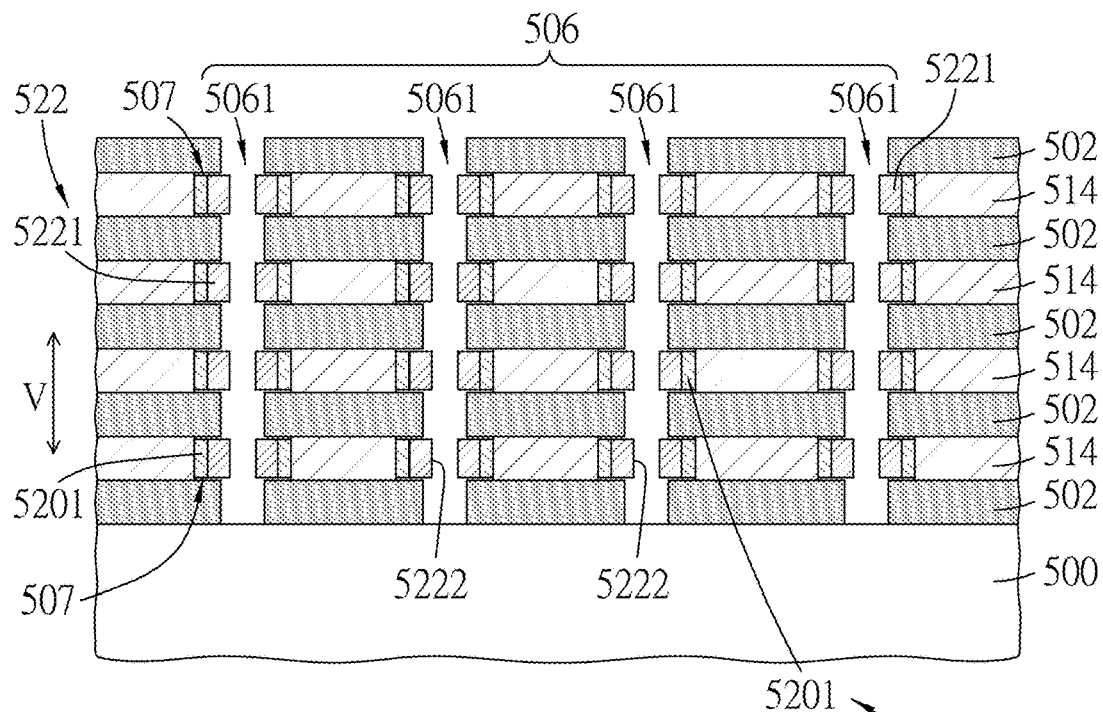
Figure 25:
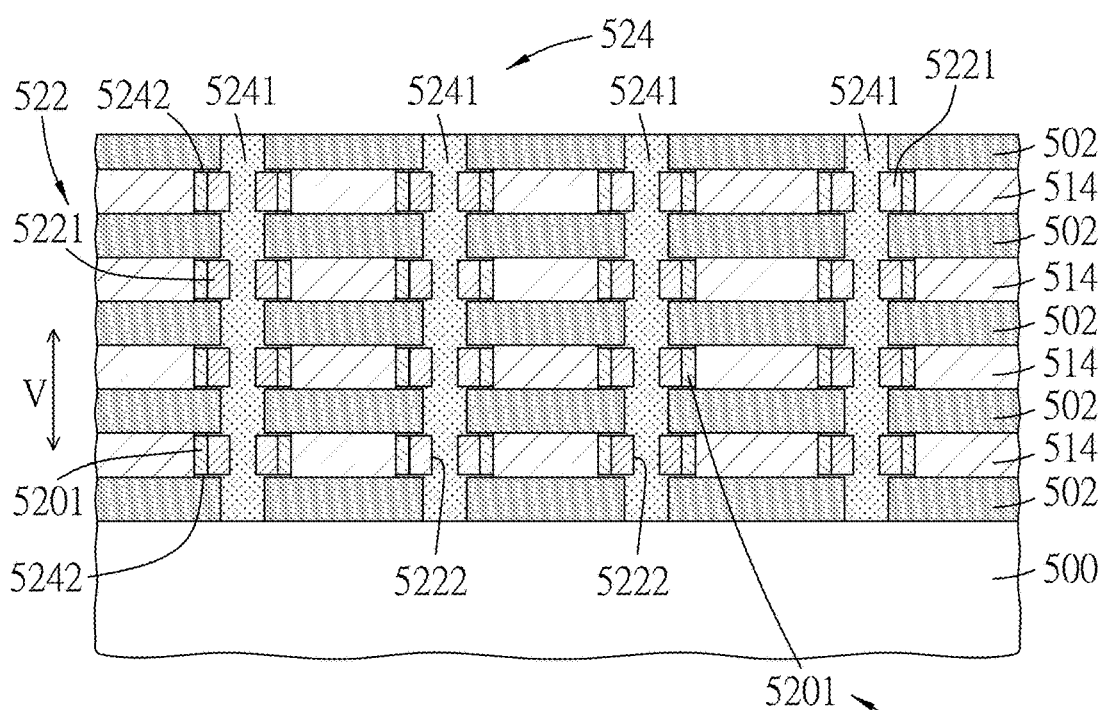
Figure 26:
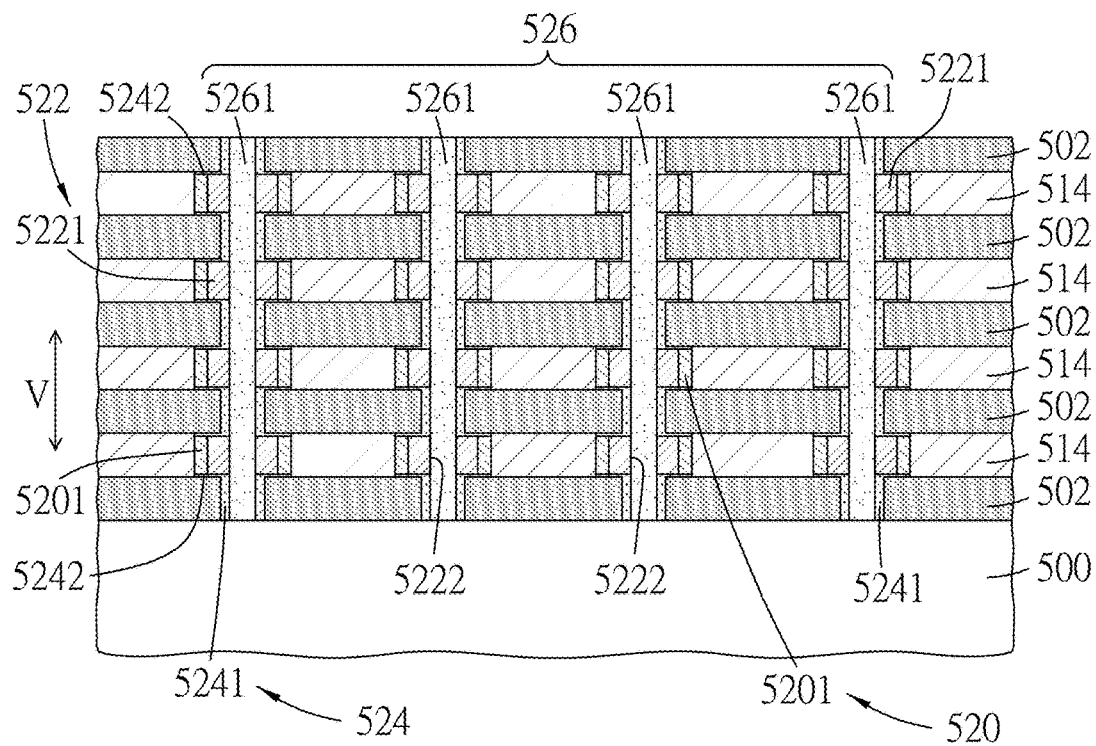

FIG. 23 shows a semiconductor structure which is an alternative to that shown in FIG. 18, where in FIG. 23, each of the channel sub-layers 5221 may be formed to extend into a corresponding one of the trenches 5061. Then, as shown in FIG. 24, the blocking layer 518 is removed. Afterwards, as shown in FIG. 25, the isolation sub-layers 5241 are formed to fill the trenches 5061 (see FIG. 24), and the side portions 5242 are formed to fill the gaps 507 (see FIG. 24). Subsequently, the source/drain segments 5261 are formed in the isolation sub-layers 5241 to be connected to the channel sub-layers 5221 (see FIG. 26). In some embodiments, the trenches (not shown) formed in the isolation sub-layers 5241 to be filled with the source/drain segments 5261 may be formed by using an etchant that etches through the isolation sub-layers 5241 but leaving the channel sub-layers 5221 substantially unetched.

Figure 27:
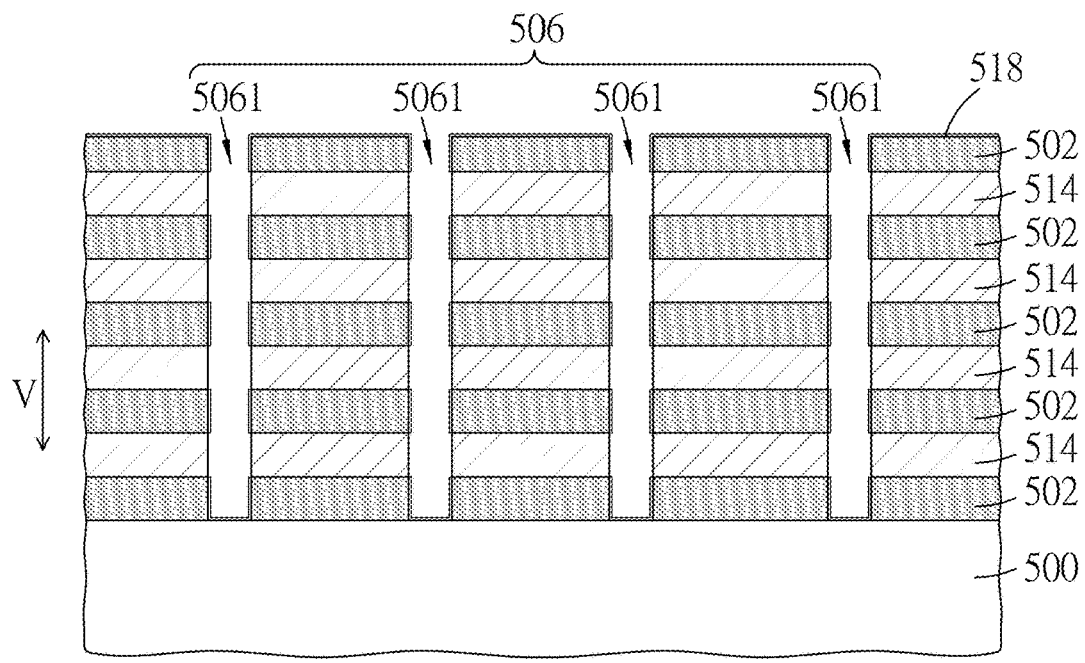
Figure 28:
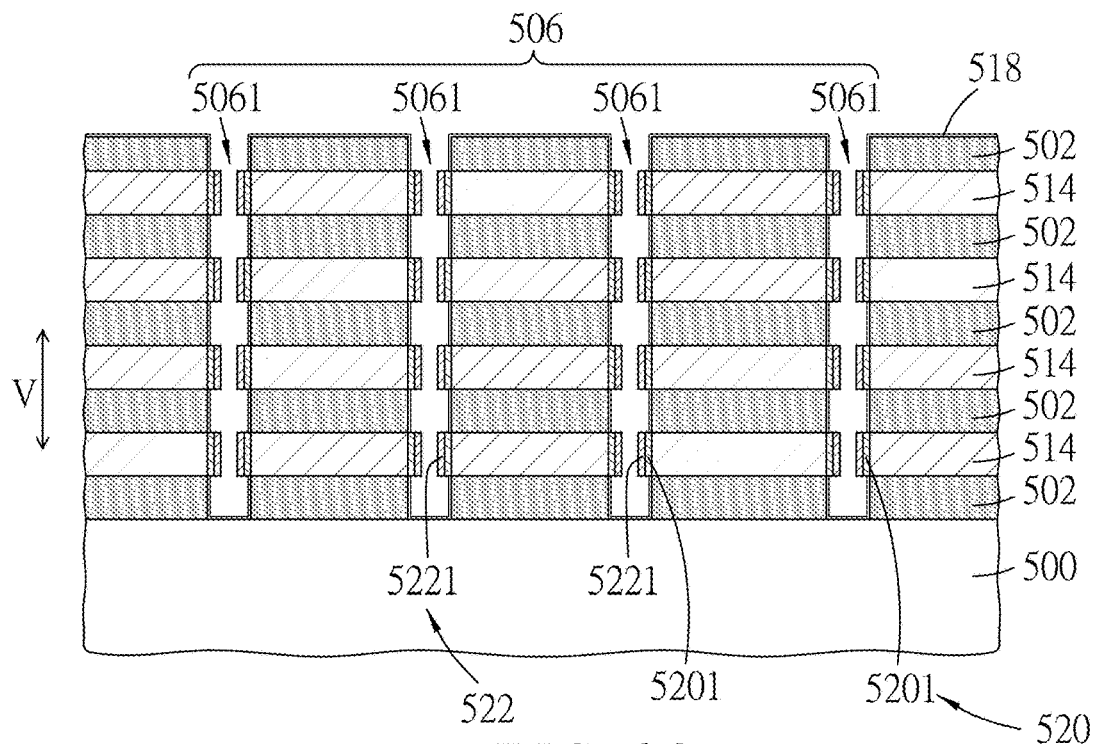
Figure 29:
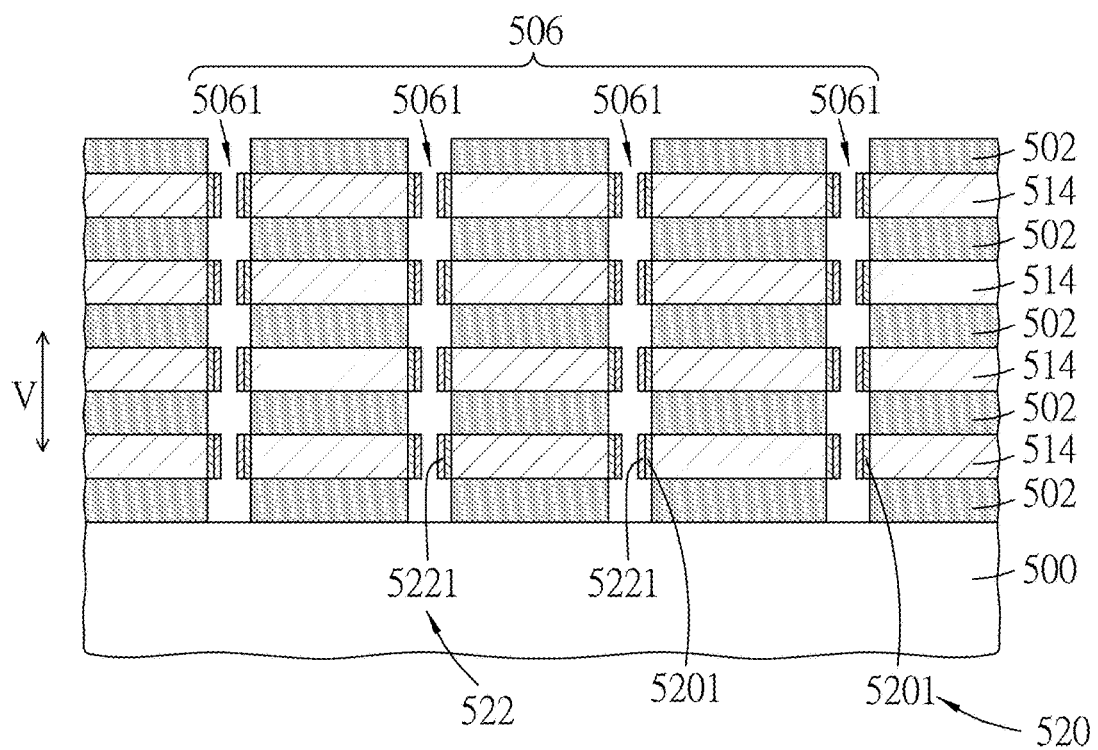
Figure 30:
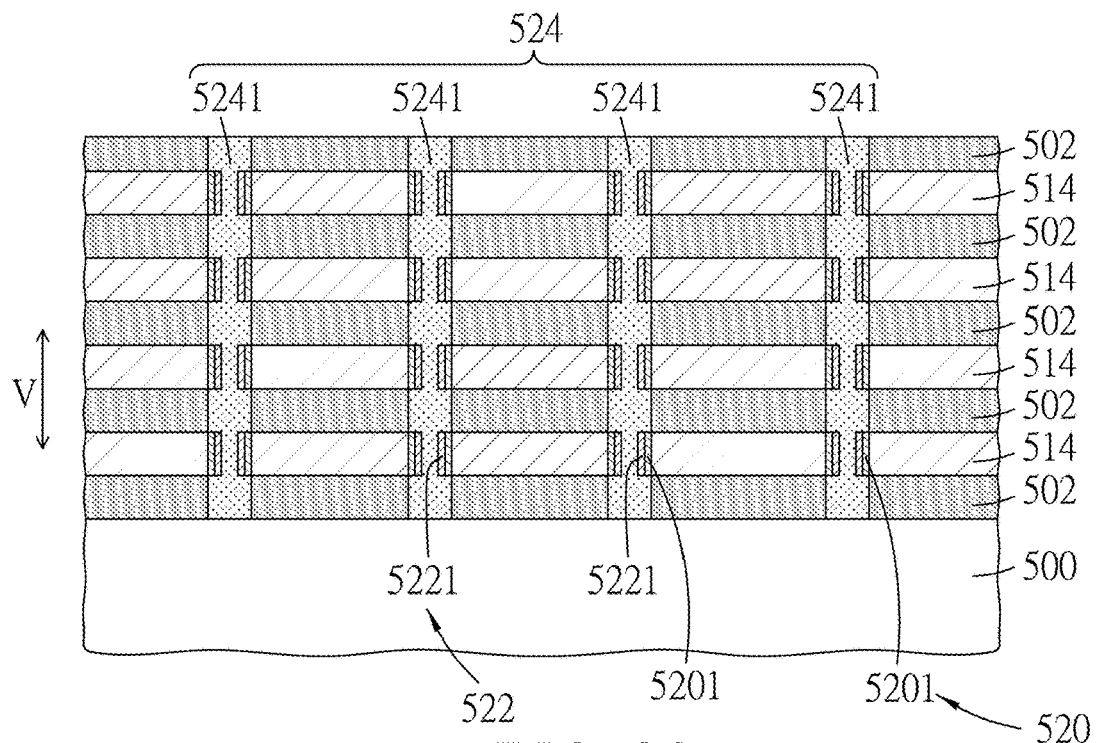
Figure 31:
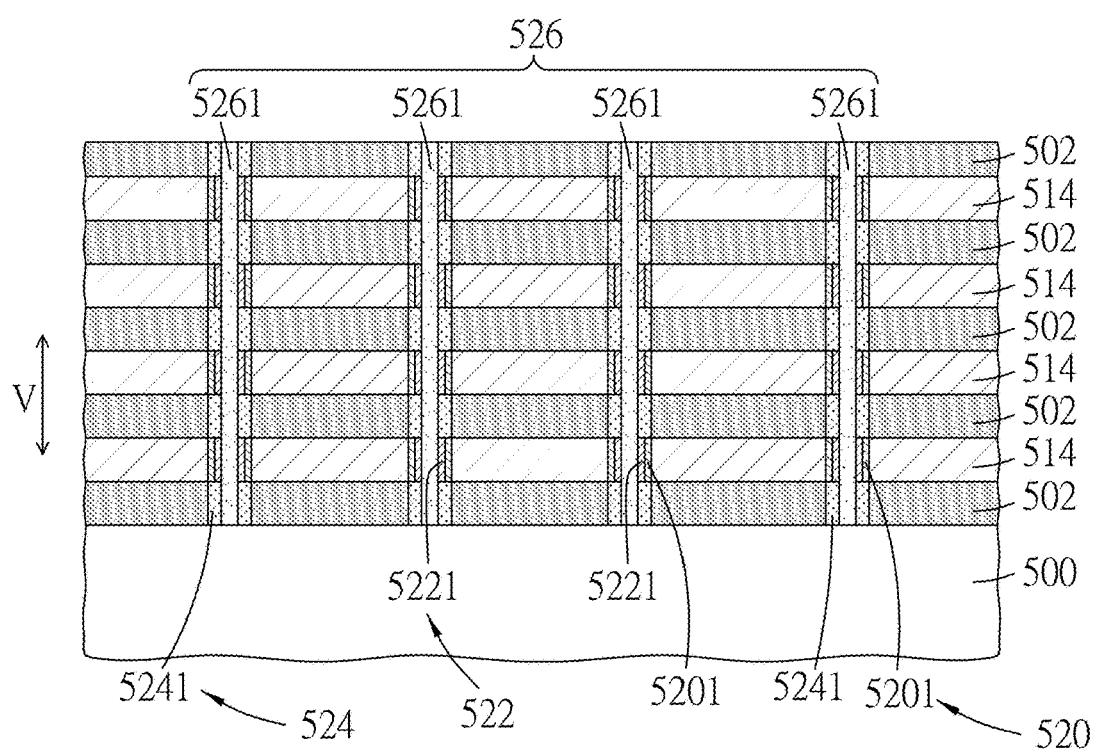

Referring to FIG. 27, after forming the trenches 5061 as shown in FIG. 15, the process of forming the recesses 516 (see FIG. 16) may be omitted, and the blocking layer 518 is formed to cover the first dielectric layers 502, and in some embodiments, the blocking layer 518 further covers the top surface 5001 of the semiconductor substrate 500 (see FIG. 15). Then, as shown in FIG. 28, the selectively-deposited sub-layers 5201 and the channel sub-layers 5221 are formed on the conductive layers 514 outside of the blocking layer 518. Afterwards, as shown in FIG. 29, the blocking layer 518 (see FIG. 28) is removed. Subsequently, the isolation sub-layers 5241 are formed to fill the trenches 5061 (see FIG. 29). Then, as shown in FIG. 31, the source/drain segments 5261 are formed in the isolation sub-layers 5241 to be connected to the channel sub-layers 5221. In some embodiments, the trenches (not shown) formed in the isolation sub-layers 5241 to be filled with the source/drain segments 5261 may be formed by using an etchant that etches through the isolation sub-layers 5241 but leaving the channel sub-layers 5221 substantially unetched.

The blocking layer 212 (see FIG. 4) allows the selectively-deposited layers 222, 520 to be selectively formed on the conductive feature 206 or the conductive layers 514 without the requirement to deposit a blanket layer and etching the blanket layer to form the selectively-deposited layers 222, 520 with desired shape, thereby eliminating the issues of photolithography-related misalignment and etching damage associated with the use of etching technique to define film pattern. In addition, the use of blocking layer also allows the selective formation of films on a vertical sidewall in a narrow trench, which may not be achievable by depositing a blanket layer and etching the blanket layer. Moreover, since the selectively-deposited films are formed in certain areas, the crystallinity of the selectively-deposited films is easier to control, compared to depositing a blanket film in large areas.

In accordance with some embodiments of the present disclosure, a method for manufacturing a semiconductor feature includes: alternatingly forming a plurality of first dielectric layers and a plurality of second dielectric layers on a semiconductor substrate along a vertical direction substantially perpendicular to the semiconductor substrate; forming a plurality of trenches that penetrate the first dielectric layers and the second dielectric layers, and that are separated from each other; forming a plurality of support segments respectively filling the trenches; removing the second dielectric layers to form a plurality of spaces; forming a plurality of conductive layers respectively filling the spaces; removing the support segments from the trenches so as to expose the conductive layers and side surfaces of the first dielectric layers from the trenches; selectively forming a blocking layer covering the first dielectric layers outside of the conductive layers; forming a plurality of selectively-deposited sub-layers on the exposed conductive layers outside of the blocking layer, each of the selectively-deposited sub-layers and being connected to a corresponding one of the conductive layers; forming a plurality of channel sub-layers on the selectively-deposited sub-layers outside of the blocking layer, each of the channel sub-layers being connected to a respective one of the selectively-deposited sub-layers; removing the blocking layer; forming a plurality of isolation sub-layers respectively filling the trenches; and forming a plurality of source/drain segments in the isolation sub-layers, each of the source/drain segments penetrating a corresponding one of the isolation sub-layers along the vertical direction and being connected to corresponding ones of the channel sub-layers.

In accordance with some embodiments of the present disclosure, each of the trenches extends along a first direction that is substantially parallel to the semiconductor substrate and that is substantially perpendicular to the vertical direction. The trenches are separated from each other along a second direction that is substantially perpendicular to the first direction and the vertical direction. In the step of forming the selectively-deposited sub-layers, each of the selectively-deposited sub-layers is formed to extend along the first direction, such that adjacent two of the selectively-deposited sub-layers are separated from each other along the vertical direction. In the step of forming the channel sub-layers, each of the channel sub-layers is formed to extend along the first direction, such that adjacent two of the channel sub-layers are separated from each other along the vertical direction.

In accordance with some embodiments of the present disclosure, the method further includes, after the step of removing the support segments and before the step of selectively forming the blocking layer, removing side portions of each of the conductive layers that face the corresponding trenches to form two recesses at two opposite sides of each of the conductive layers so that a part of a surface of a corresponding one of the first dielectric layers that is adjacent to the each of the conductive layers is exposed. In the step of selectively forming the blocking layer, the blocking layer covers the side surface and the exposed part of the surface of each of the first dielectric layers.

In accordance with some embodiments of the present disclosure, in the step of forming the channel sub-layers, each of the channel sub-layers is formed to have a side surface that is substantially flush with the side surface of a corresponding one of the first dielectric layers.

In accordance with some embodiments of the present disclosure, the blocking layer is hydrophobic. In the step of forming the selectively-deposited sub-layers, a plurality of hydroxyl groups are formed on the conductive layers outside of the blocking layer, and each of the selectively-deposited sub-layers is formed on the corresponding one of the conductive layers and bonded to corresponding ones of the hydroxyl groups.

In accordance with some embodiments of the present disclosure, in the step of forming the hydroxyl groups, water vapor is introduced to react with the conductive layers to form the hydroxyl groups.

In accordance with some embodiments of the present disclosure, in the step of forming the selectively-deposited sub-layers, a precursor for forming the selectively-deposited sub-layers and the water vapor are alternatingly introduced.

In accordance with some embodiments of the present disclosure, in the step of forming the channel sub-layers, a plurality of hydroxyl groups are formed on the selectively-deposited sub-layers, followed by forming the channel sub-layers that are respectively disposed on the selectively-deposited sub-layers and that are connected to the hydroxyl groups.

In accordance with some embodiments of the present disclosure, a method for selectively depositing film includes: forming a conductive feature in a dielectric base layer, the conductive feature being exposed from the dielectric base layer; selectively forming a hydrophobic blocking layer on the dielectric base layer outside of the conductive feature; selectively forming a plurality of hydroxyl groups on the conductive feature outside of the hydrophobic blocking layer; and forming a selectively-deposited layer on the conductive feature outside of the hydrophobic blocking layer, the selectively-deposited layer being bonded with the hydroxyl groups.

In accordance with some embodiments of the present disclosure, in the step of selectively forming the hydroxyl groups on the conductive feature, water vapor is introduced to react with the conductive feature to form the hydroxyl groups.

In accordance with some embodiments of the present disclosure, in the step of forming the selectively-deposited layer, a precursor for forming the selectively-deposited layer and the water vapor are alternatingly introduced.

In accordance with some embodiments of the present disclosure, the method further includes forming a conductive channel layer on the selectively-deposited layer outside of the hydrophobic blocking layer.

In accordance with some embodiments of the present disclosure, the method further includes, after the step of forming the selectively-deposited layer, treating the selectively-deposited layer and the hydrophobic blocking layer with an oxygen-containing plasma to remove the hydrophobic blocking layer.

In accordance with some embodiments of the present disclosure, the method further includes, after the step of forming the conductive channel layer, treating the selectively-deposited layer, the conductive channel layer and the hydrophobic blocking layer with an oxygen-containing plasma to remove the hydrophobic blocking layer.

In accordance with some embodiments of the present disclosure, a semiconductor feature includes a semiconductor substrate, a plurality of dielectric layers, a plurality of conductive layers, a plurality of isolation sub-layers, a plurality of source/drain segments, a plurality of selectively-deposited ferroelectric sub-layers, and a plurality of channel sub-layers. The dielectric layers and the conductive layers are alternatingly disposed on the semiconductor substrate along a vertical direction substantially perpendicular to the semiconductor substrate. The isolation sub-layers penetrate the dielectric layers and the conductive layers, and are separated from each other. Each of the source/drain segments penetrates a corresponding one of the isolation sub-layers. The selectively-deposited ferroelectric sub-layers are separated from each other. Each of the selectively-deposited ferroelectric sub-layers is connected to a corresponding one of the conductive layers. The channel sub-layers are separated from each other. Each of the channel sub-layers is connected between a respective one of the selectively-deposited ferroelectric sub-layers and corresponding ones of the source/drain segments.

In accordance with some embodiments of the present disclosure, each of the selectively-deposited ferroelectric sub-layers extends along a first direction that is substantially parallel to the semiconductor substrate and that is substantially perpendicular to the vertical direction. Adjacent two of the selectively-deposited ferroelectric sub-layers are separated from each other along the vertical direction.

In accordance with some embodiments of the present disclosure, the selectively-deposited ferroelectric sub-layers include HZO, $CaTiO_3$, $PbTiO_3$, $BaTiO_3$, or any combination thereof.

In accordance with some embodiments of the present disclosure, the channel sub-layers include IGZO, InZnSnO, ZnO, InGaO, AlInGaZnO, InWO, InZnO, Ce-doped InTiO, InTiZnO, or any combination thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor feature, comprising:
    alternatingly forming a plurality of first dielectric layers and a plurality of second dielectric layers on a semiconductor substrate along a vertical direction substantially perpendicular to the semiconductor substrate;
    forming a plurality of trenches that penetrate the first dielectric layers and the second dielectric layers, and that are separated from each other;
    forming a plurality of support segments respectively filling the trenches;
    removing the second dielectric layers to form a plurality of spaces;
    forming a plurality of conductive layers respectively filling the spaces;
    removing the support segments from the trenches so as to expose the conductive layers and side surfaces of the first dielectric layers from the trenches;

selectively forming a blocking layer covering the first dielectric layers outside of the conductive layers;

forming a plurality of selectively-deposited sub-layers on the exposed conductive layers outside of the blocking layer, each of the selectively-deposited sub-layers being connected to a corresponding one of the conductive layers;

forming a plurality of channel sub-layers on the selectively-deposited sub-layers outside of the blocking layer; each of the channel sub-layers being connected to a respective one of the selectively-deposited sub-layers;

removing the blocking layer;

forming a plurality of isolation sub-layers respectively filling the trenches; and forming a plurality of source/drain segments in the isolation sub-layers, each of the source/drain segments penetrating a corresponding one of the isolation sub-layers along the vertical direction and being connected to corresponding ones of the channel sub-layers.

2. The method as claimed in claim 1, wherein:

each of the trenches extends along a first direction that is substantially parallel to the semiconductor substrate and that is substantially perpendicular to the vertical direction, the trenches being separated from each other along a second direction that is substantially perpendicular to the first direction and the vertical direction;

in the step of forming the selectively-deposited sub-layers, each of the selectively-deposited sub-layers is formed to extend along the first direction, such that adjacent two of the selectively-deposited sub-layers are separated from each other along the vertical direction; and in the step of forming the channel sub-layers, each of the channel sub-layers is formed to extend along the first direction, such that adjacent two of the channel sub-layers are separated from each other along the vertical direction.

3. The method as claimed in claim 1, further comprising, after the step of removing the support segments and before the step of selectively forming the blocking layer, removing side portions of each of the conductive layers that face the corresponding trenches to form two recesses at two opposite sides of each of the conductive layers so that a part of a surface of a corresponding one of the first dielectric layers that is adjacent to each of the conductive layers is exposed, in the step of selectively forming the blocking layer, the blocking layer covering the side surface and the exposed part of the surface of each of the first dielectric layers.

4. The method as claimed in claim 3, wherein, in the step of forming the channel sub-layers, each of the channel sub-lavers is formed to have a side surface that is substantially flush with the side surface of a corresponding one of the first dielectric layers.

5. The method as claimed in claim 1, wherein:

the blocking layer is hydrophobic; and in the step of forming the selectively-deposited sub-layers, a plurality of hydroxyl groups are formed on the conductive layers outside of the blocking layer, and each of the selectively-deposited sub-layers is formed on the corresponding one of the conductive layers and is bonded to corresponding ones of the hydroxyl groups.

6. The method as claimed in claim 5, wherein, in the step of forming the hydroxyl groups, water vapor is introduced to react with the conductive layers to form the hydroxyl groups.

7. The method as claimed in claim 6, wherein, in the step of forming the selectively-deposited sub-layers, a precursor for forming the selectively-deposited sub-layers and the water vapor are alternatingly introduced.

8. The method as claimed in claim 7, wherein, in the step of forming the channel sub-layers, a plurality of hydroxyl groups are formed on the selectively-deposited sub-layers, followed by forming the channel sub-layers that are respectively disposed on the selectively-deposited sub-layers and that are connected to the hydroxyl groups.

9. The method as claimed in claim 8, wherein, in the step of forming the channel sub-layers, a precursor for forming the channel sub-layers and the water vapor are alternatingly introduced.

10. A method for manufacturing a semiconductor feature, comprising:

alternatingly forming a plurality of first dielectric layers and a plurality of second dielectric layers on a semiconductor substrate along a vertical direction substantially perpendicular to the semiconductor substrate;

forming a plurality of trenches that penetrate the first dielectric layers and the second dielectric layers, and that are separated from each other;

forming a plurality of support segments respectively filling the trenches;

replacing the second dielectric layers with a plurality of conductive layers, respectively;

removing the support segments from the trenches so as to expose the conductive layers and side surfaces of the first dielectric layers from the trenches;

selectively forming a blocking layer covering the first dielectric layers outside of the conductive layers;

forming a plurality of selectively-deposited sub-layers on the exposed conductive layers outside of the blocking layer, each of the selectively-deposited sub-layers being connected to a corresponding one of the conductive layers;

forming a plurality of channel sub-layers on the selectively-deposited sub-layers outside of the blocking layer, each of the channel sub-layers being connected to a respective one of the selectively-deposited sub-layers;

removing the blocking layer;

forming a plurality of isolation sub-layers respectively filling the trenches; and forming a plurality of source/drain segments in the isolation sub-layers, each of the source/drain segments penetrating a corresponding one of the isolation sub-layers along the vertical direction and being connected to corresponding ones of the channel sub-layers.

11. The method as claimed in claim 10, wherein:

each of the trenches extends along a first direction that is substantially parallel to the semiconductor substrate and that is substantially perpendicular to the vertical direction, the trenches being separated from each other along a second direction that is substantially perpendicular to the first direction and the vertical direction;

in the step of forming the selectively-deposited sub-layers, each of the selectively-deposited sub-layers is formed to extend along the first direction, such that adjacent two of the selectively-deposited sub-layers are separated from each other along the vertical direction; and in the step of forming the channel sub-layers, each of the channel sub-layers is formed to extend along the first direction, such that adjacent two of the channel sub-layers are separated from each other along the vertical direction.

12. The method as claimed in claim 10, further comprising, after the step of removing the support segments and before the step of selectively forming the blocking layer, removing side portions of each of the conductive layers that face the corresponding trenches to form two recesses at two opposite sides of each of the conductive layers so that a part of a surface of a corresponding one of the first dielectric layers that is adjacent to each of the conductive layers is exposed, in the step of selectively forming the blocking layer, the blocking layer covering the side surface and the exposed part of the surface of each of the first dielectric layers.

13. The method as claimed in claim 12, wherein, in the step of forming the channel sub-layers, each of the channel sub-layers is formed to have a side surface that is substantially flush with the side surface of a corresponding one of the first dielectric layers.

14. The method as claimed in claim 10, wherein:
the blocking layer is hydrophobic; and
in the step of forming the selectively-deposited sub-layers, a plurality of hydroxyl groups are formed on the conductive layers outside of the blocking layer, and each of the selectively-deposited sub-layers is formed on the corresponding one of the conductive layers and is bonded to corresponding ones of the hydroxyl groups.

15. A method for manufacturing a semiconductor feature, comprising:
alternatingly forming a plurality of first dielectric layers and a plurality of second dielectric layers on a semiconductor substrate;
forming a plurality of trenches that penetrate the first dielectric layers and the second dielectric layers, and that are separated from each other;
forming a plurality of support segments respectively filling the trenches;
removing the second dielectric layers to form a plurality of spaces;
forming a plurality of conductive layers respectively filling the spaces;
removing the support segments from the trenches so as to expose the conductive layers and side surfaces of the first dielectric layers from the trenches;
selectively forming a blocking layer covering the first dielectric layers outside of the conductive layers;
forming a plurality of selectively-deposited sub-layers on the exposed conductive layers outside of the blocking layer, each of the selectively-deposited sub-layers being connected to a corresponding one of the conductive layers;
forming a plurality of channel sub-layers on the selectively-deposited sub-layers outside of the blocking layer, each of the channel sub-layers being connected to a respective one of the selectively-deposited sub-layers; and
removing the blocking layer.

16. The method as claimed in claim 15, wherein:
the blocking layer is hydrophobic; and
in the step of forming the selectively-deposited sub-layers, a plurality of hydroxyl groups are formed on the conductive layers outside of the blocking layer, and each of the selectively-deposited sub-layers is formed on the corresponding one of the conductive layers and is bonded to corresponding ones of the hydroxyl groups.

17. The method as claimed in claim 16, wherein, in the step of forming the hydroxyl groups, water vapor is introduced to react with the conductive layers to form the hydroxyl groups.

18. The method as claimed in claim 17, wherein, in the step of forming the selectively-deposited sub-layers, a precursor for forming the selectively-deposited sub-layers and the water vapor are alternatingly introduced.

19. The method as claimed in claim 18, wherein, in the step of forming the channel sub-layers, a plurality of hydroxyl groups are formed on the selectively-deposited sub-layers, followed by forming the channel sub-layers that are respectively disposed on the selectively-deposited sub-layers and that are connected to the hydroxyl groups.

20. The method as claimed in claim 19, wherein, in the step of forming the channel sub-layers, a precursor for forming the channel sub-layers and the water vapor are alternatingly introduced.

* * * * *